US009543196B2

(12) United States Patent
Park et al.

(10) Patent No.: US 9,543,196 B2
(45) Date of Patent: Jan. 10, 2017

(54) METHODS OF FABRICATING SEMICONDUCTOR DEVICES USING NANOWIRES

(71) Applicant: Samsung Electronics Co., Ltd., Suwon-si, Gyeonggi-do (KR)

(72) Inventors: Hyun Park, Suwon-si (KR); Dong-Hyun Im, Suwon-si (KR); Soon-Gun Lee, Hwaseong-si (KR); Jong-Myeong Lee, Seongnam-si (KR); Han-Jin Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 14/674,332

(22) Filed: Mar. 31, 2015

(65) Prior Publication Data

US 2016/0064277 A1 Mar. 3, 2016

(30) Foreign Application Priority Data

Aug. 27, 2014 (KR) ........................ 10-2014-0112589

(51) Int. Cl.
*H01L 21/20* (2006.01)
*H01L 21/82* (2006.01)
*H01L 21/768* (2006.01)
*B82Y 10/00* (2011.01)
*H01L 21/02* (2006.01)
(Continued)

(52) U.S. Cl.
CPC ......... *H01L 21/76837* (2013.01); *B82Y 10/00* (2013.01); *H01L 21/02532* (2013.01); *H01L 21/02603* (2013.01); *H01L 21/02645* (2013.01); *H01L 21/02653* (2013.01); *H01L 21/76802* (2013.01); *H01L 21/76844* (2013.01); *H01L 21/76877* (2013.01); *H01L 27/10814* (2013.01); *H01L 27/10817* (2013.01);
(Continued)

(58) Field of Classification Search
CPC .......... H01L 21/02; H01L 21/00; H01L 29/40; H01L 27/24; H01L 45/08; H01L 45/16
USPC ........ 438/386, 627, 637, 999, 267; 977/810; 257/2-4
See application file for complete search history.

(56) References Cited

U.S. PATENT DOCUMENTS 7,659,164 B1    2/2010  Yoo
7,776,759 B2    8/2010  Lahnor et al.
(Continued)

FOREIGN PATENT DOCUMENTS

EP    1 724 785 A1    11/2006
KR    1020100030161   3/2010
KR    1020100053795 A  5/2010

OTHER PUBLICATIONS

Heo et al., "Massive integration of inorganic nanowire-based structures on solid substrates for device applications," Journal of Materials Chemistry, 2009, 19, pp. 901-908.
(Continued)

*Primary Examiner* — Jessica Manno
*Assistant Examiner* — Sheikh Maruf
(74) *Attorney, Agent, or Firm* — Myers Bigel, P.A.

(57) ABSTRACT

Methods of fabricating a semiconductor device may include forming guide patterns exposing base patterns, forming first nanowires on the base patterns by performing a first nanowire growth process, forming a first molding insulating layer between the first nanowires, forming holes exposing
(Continued)

surfaces of the base patterns by removing the nanowires, and forming first electrodes including a conductive material in the holes.

15 Claims, 49 Drawing Sheets

(51) Int. Cl.
  *H01L 27/108* (2006.01)
  *H01L 49/02* (2006.01)
  *H01L 29/41* (2006.01)

(52) U.S. Cl.
  CPC ........ *H01L 27/10855* (2013.01); *H01L 28/91* (2013.01); *H01L 29/413* (2013.01)

(56) References Cited

U.S. PATENT DOCUMENTS

| | | | |
|---|---|---|---|
| 7,998,858 B2 | 8/2011 | Gutsche et al. | |
| 8,004,167 B2 | 8/2011 | Ishida et al. | |
| 8,410,496 B2 | 4/2013 | Hersee et al. | |
| 2004/0043208 A1* | 3/2004 | Fukutani | C23C 14/06 428/304.4 |
| 2005/0276093 A1* | 12/2005 | Graham | B82Y 10/00 365/149 |
| 2007/0105356 A1 | 5/2007 | Wu et al. | |
| 2008/0315430 A1 | 12/2008 | Weber et al. | |
| 2009/0258470 A1* | 10/2009 | Choi | C23C 16/308 438/386 |
| 2010/0120212 A1* | 5/2010 | Yang | H01L 21/0337 438/239 |
| 2010/0178729 A1* | 7/2010 | Yoon | H01L 27/249 438/104 |
| 2012/0019980 A1* | 1/2012 | Cho | H01L 27/10852 361/311 |
| 2012/0313067 A1* | 12/2012 | Lee | H01L 45/06 257/2 |
| 2013/0153993 A1* | 6/2013 | Chang | B82Y 10/00 257/330 |
| 2014/0256078 A1* | 9/2014 | Jin | B81C 1/00515 438/57 |
| 2015/0048294 A1* | 2/2015 | Park | H01L 27/2454 257/2 |
| 2015/0162383 A1* | 6/2015 | Hwang | H01L 45/08 257/4 |

OTHER PUBLICATIONS

Hong et al., "Controlled epitaxial growth modes of ZnO nanostructures using different substrate crystal planes," Journal of Materials Chemistry, 2009, 19, pp. 941-947.

Morales et al., "A Laser Ablation Method for the Synthesis of Crystalline Semiconductor Nanowires," Science, vol. 279, Jan. 9, 1998, pp. 208-211.

* cited by examiner

METHODS OF FABRICATING SEMICONDUCTOR DEVICES USING NANOWIRES

CROSS-REFERENCE TO RELATED APPLICATION

This application claims priority under 35 U.S.C. §119 to Korean Patent Application No. 10-2014-0112589 filed on Aug. 27, 2014, the disclosure of which is hereby incorporated by reference in its entirety.

BACKGROUND

Technical Field

Embodiments of the inventive concept relate to a method of fabricating a semiconductor device using nanowires, and more specifically, a method of forming a capacitor structure, contact structure, and line structure of a semiconductor device using silicon nanowires and insulating nanowires.

Discussion of Related Art

As the degree of integration of semiconductor devices has been increasing, horizontal sizes are decreasing and, at the same time, vertical heights are increasing in storage electrodes of capacitor structures, contact structures, and line structures. Accordingly, photolithography and etching processes for forming these patterns have become difficult. To solve the technical challenges, methods of forming fine patterns using a nanowire process and forming air-gaps between the patterns to reduce parasitic capacitance existing between the patterns are proposed.

SUMMARY

Some embodiments of the inventive concept provide a capacitor structure of a semiconductor device using nanowires, and a method of forming the capacitor structure.

Some embodiments of the inventive concept provide a method of forming a contact structure and a line structure of a semiconductor device by using nanowires.

In accordance with an aspect of the inventive concept, a method of forming a semiconductor device includes forming guide patterns exposing base patterns, forming first nanowires on the base patterns by performing a first nanowire growth process, forming a first molding insulating layer between the first nanowires, forming holes exposing surfaces of the base patterns by removing the nanowires, and forming first electrodes by filling the holes with a conductive material.

In accordance with another aspect of the inventive concept, a method of forming a semiconductor device includes forming guide patterns exposing base patterns, forming first nanowires on the base patterns, forming a first molding insulating layer between the first nanowires, recessing an upper surface of the first molding insulating layer to be lower than upper surfaces of the first nanowires, forming a first supporter exposing the upper surfaces of the first nanowires and surrounding side surfaces of the first nanowires on the first molding insulating layer, forming storage holes exposing surfaces of the base patterns by removing the first nanowires, and forming first electrodes by filling the storage holes with a conductive material.

In accordance with still another aspect of the inventive concept, a method of forming a semiconductor device includes forming guide patterns exposing contact pads, forming lower silicon nanowires on the exposed contact pads, forming a lower molding insulating layer between the lower silicon nanowires, forming a lower supporter horizontally connecting upper portions of the lower silicon nanowires on the lower molding insulating layer, forming upper silicon nanowires on the lower silicon nanowires, forming an upper molding insulating layer filling between the upper silicon nanowires, forming an upper supporter horizontally connecting upper portions of the upper silicon nanowires on the upper molding insulating layer, forming storage electrodes by siliciding the lower and upper silicon nanowires, forming a dielectric layer on the storage electrodes, and forming a plate electrode on the dielectric layer.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference numerals denote the same respective parts throughout the different views. In the drawings.

DETAILED DESCRIPTION

Figure 1:
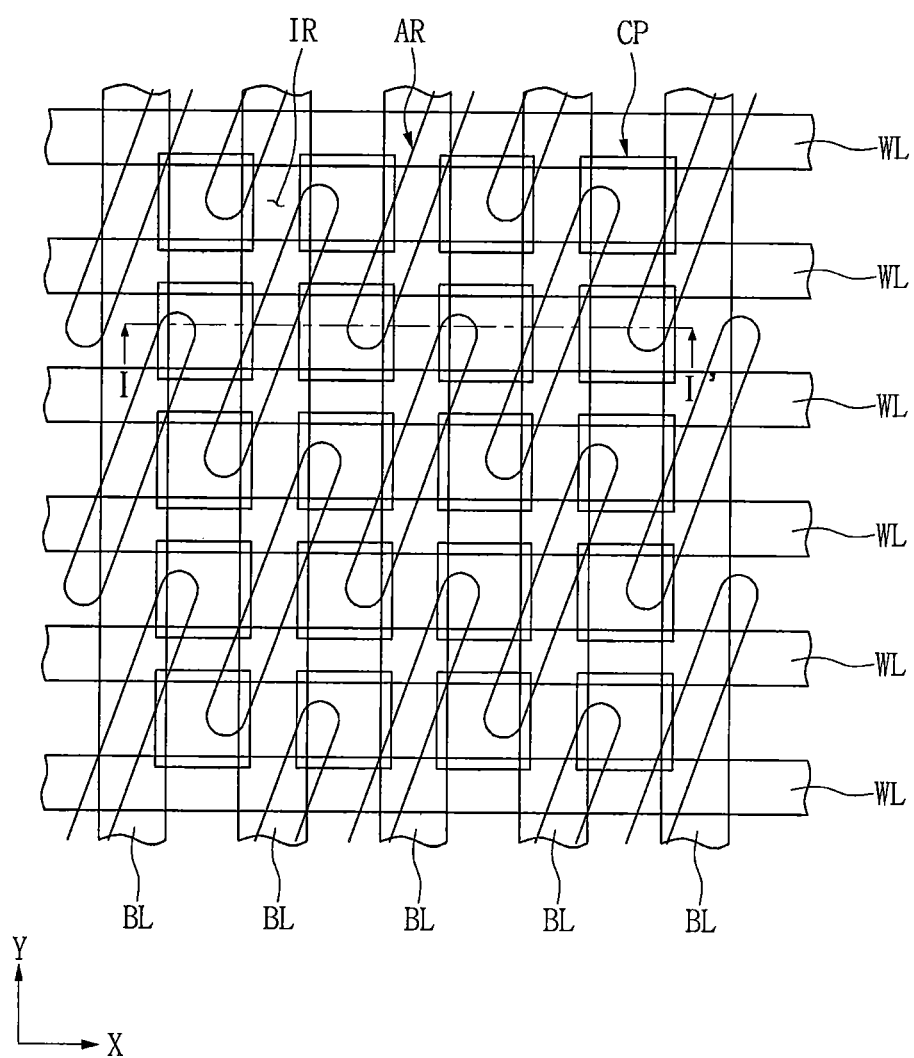
FIG. 1 is a schematic layout of a semiconductor device in accordance with various embodiments of the inventive concept.

Various embodiments will now be described more fully with reference to the accompanying drawings in which some embodiments are shown. These inventive concept may, however, be embodied in different forms and should not be construed as limited to the embodiments set forth herein.

The terminology used herein to describe embodiments of the inventive concept is not intended to limit the scope of the inventive concept. The use of the singular form in the present document should not preclude the presence of more than one referent. In other words, elements of the inventive concept referred to in the singular may number one or more, unless the context clearly indicates otherwise.

It will be understood that when an element or layer is referred to as being "connected to" or "coupled to" another element or layer, it can be connected or coupled to the other element or layer or intervening elements or layers may be present. The term "and/or" includes any and all combinations of one or more referents.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to a cross-sectional view, a plan view, and/or a block diagram that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an etched region illustrated as a rectangle will, typically, have rounded or features having a predetermined curvature. Thus, the regions illustrated in the figures are schematic in nature and their shapes are not intended to illustrate the actual shape of a region of a device and are not intended to limit the scope of the present inventive concept.

The same reference numerals denote the same elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIG. 1 is a schematic layout of a semiconductor device in accordance with various embodiments of the inventive concept.

Referring to FIG. 1, a semiconductor device 10 in accordance with various embodiments of the inventive concept may include active regions AR surrounded by device isolation regions IR, word lines WL and bit lines BL intersecting the active regions AR, and capacitors CP overlapping both ending portions of the active regions AR. The active regions AR may have the shape of a bar extending in an oblique direction. The word lines WL may extend, for example, in an X-direction to intersect the active regions AR. The bit lines BL may extend, for example, in a Y-direction to intersect center portions of the active regions AR. The capacitors CP may be arranged in the form of islands overlapping the ending portions of the active regions AR disposed in areas defined by the word lines WL and the bit lines BL.

FIGS. 2A to 2H are schematic cross-sectional views of semiconductor devices, taken along the line I-I' of FIG. 1, in accordance with various embodiments of the inventive concept.

Figure 2A:
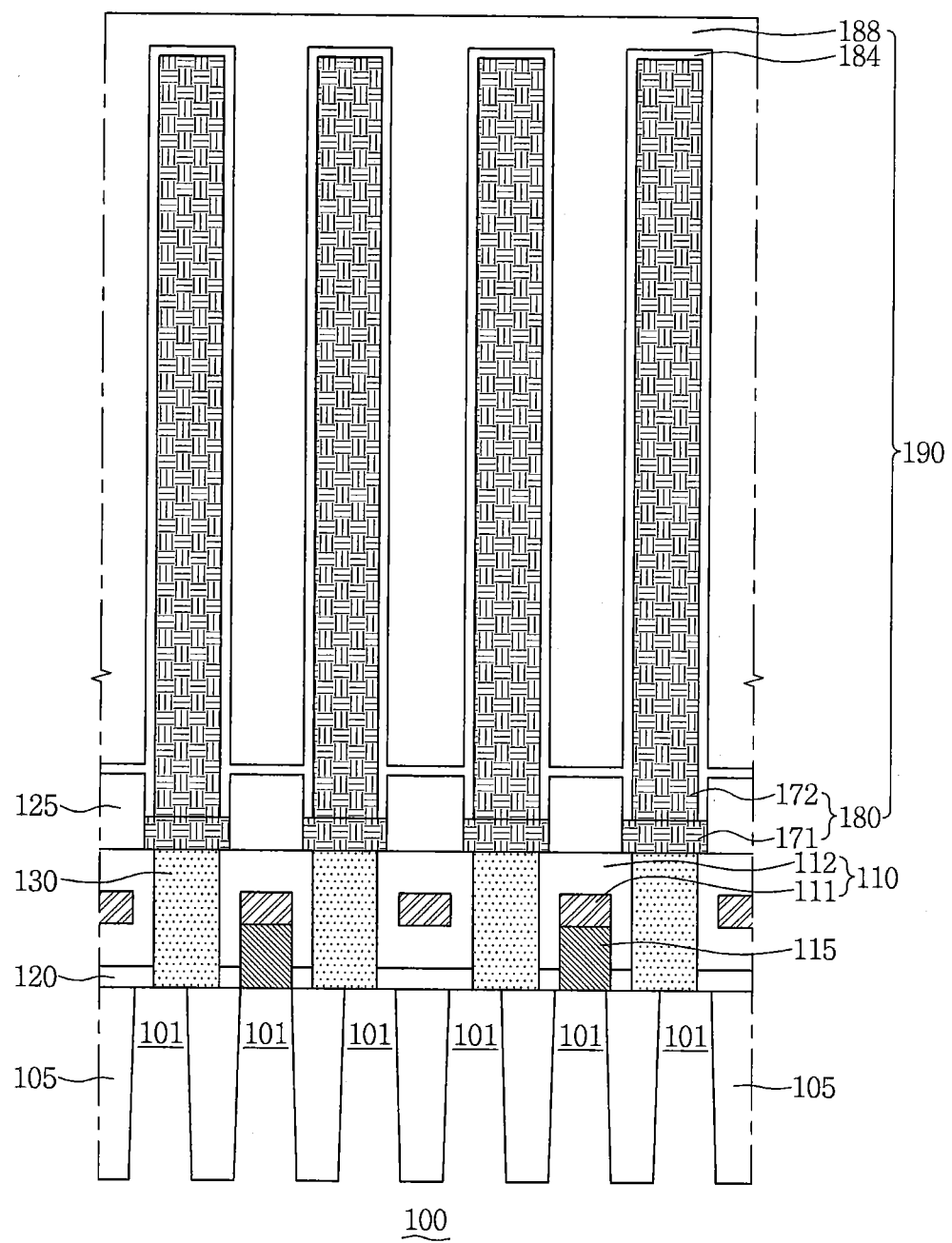
FIGS. 2A to 2H are schematic cross-sectional views of semiconductor devices, taken along the line the I-I' of FIG. 1, in accordance with various embodiments of the inventive concept.

Referring to FIG. 2A, a semiconductor device 10A in accordance with various embodiments of the inventive concept may include device isolation regions 105 defining active regions 101 in a substrate 100, bit line structures 110 disposed on the substrate 100, contact pads 130 disposed between the bit line structures 110, guide patterns 125 disposed on the bit line structures 110, and capacitor structures 190 disposed on the contact pads 130 and the guide patterns 125. The semiconductor device 10A may further include bit line contacts 115 electrically connecting portions of the active regions 101 to portions of the bit line structures 110. The semiconductor device 10A may further include an interlayer insulating layer 120 surrounding portions of side surfaces of the contact pads 130 and the bit line contacts 115.

The substrate 100 may include a silicon wafer. The active regions 101 may include source/drain regions. The device isolation regions 105 may include shallow trench isolations (STIs). The bit line structures 110 may include conductive bit line electrodes 111 and insulative bit line insulating layers 112. The bit line electrodes 111 may include barrier layers, such as a metal, a metal silicide, and/or titanium nitride (TiN). The bit line insulating layers 112 may be formed on lowers, both sides, and uppers of the bit line electrodes 111 to surround the bit line electrodes 111. The bit line insulating layers 112 may include one of silicon oxide ($SiO_2$), silicon nitride (SiN), silicon oxynitride (SiON), silicon carbonitride (SiCN), or a combination thereof.

The bit line contacts 115 may electrically connect the active regions 101 to the bit line electrodes 111. The bit line contacts 115 may include single-crystalline silicon, poly-crystalline silicon, a metal, a metal silicide, or a metal compound.

The contact pads 130 may include single-crystalline silicon, poly-crystalline silicon, a metal, a metal silicide, or a metal compound. In various embodiments, the contact pads 130 may include poly-crystalline silicon or a metal.

The interlayer insulating layer 120 may include one of $SiO_2$, SiN, SiON, SiCN, or a combination thereof.

The guide patterns 125 may be disposed on the bit line structures 110. For example, the guide patterns 125 may overlap the bitline structures 110 and the word lines WL such that the ending portions of the active regions 101 are exposed as shown in FIG. 1. The guide patterns 125 may include the same material as the bit line insulating layers 112. For example, the guide patterns 125 may include one of SiN, SiON, SiCN, or a combination thereof.

The capacitor structures 190 may include storage electrodes 180, a capacitor dielectric layer 184, and a plate electrode 188. The storage electrodes 180 may include base silicide patterns 171 and main silicide patterns 172. The base silicide patterns 171 may have a pad shape in contact with the contact pads 130. The main silicide patterns 172 may have a pillar shape disposed on the base silicide patterns 171. The base silicide patterns 171 and the main silicide patterns 172 may be materially continuous. For example, interfaces of the base silicide patterns 171 and the main silicide patterns 172 may be not visible or may not exist. The capacitor dielectric layer 184 may be conformally formed on the guide patterns 125 and the silicide patterns 170. The capacitor dielectric layer 184 may include one of metal oxides, such as $SiO_2$, SiN, hafnium oxide (HfO), or a combination thereof. The plate electrode 188 may include a metal or a metal oxide, such as tungsten (W) or TiN.

Figure 2B:
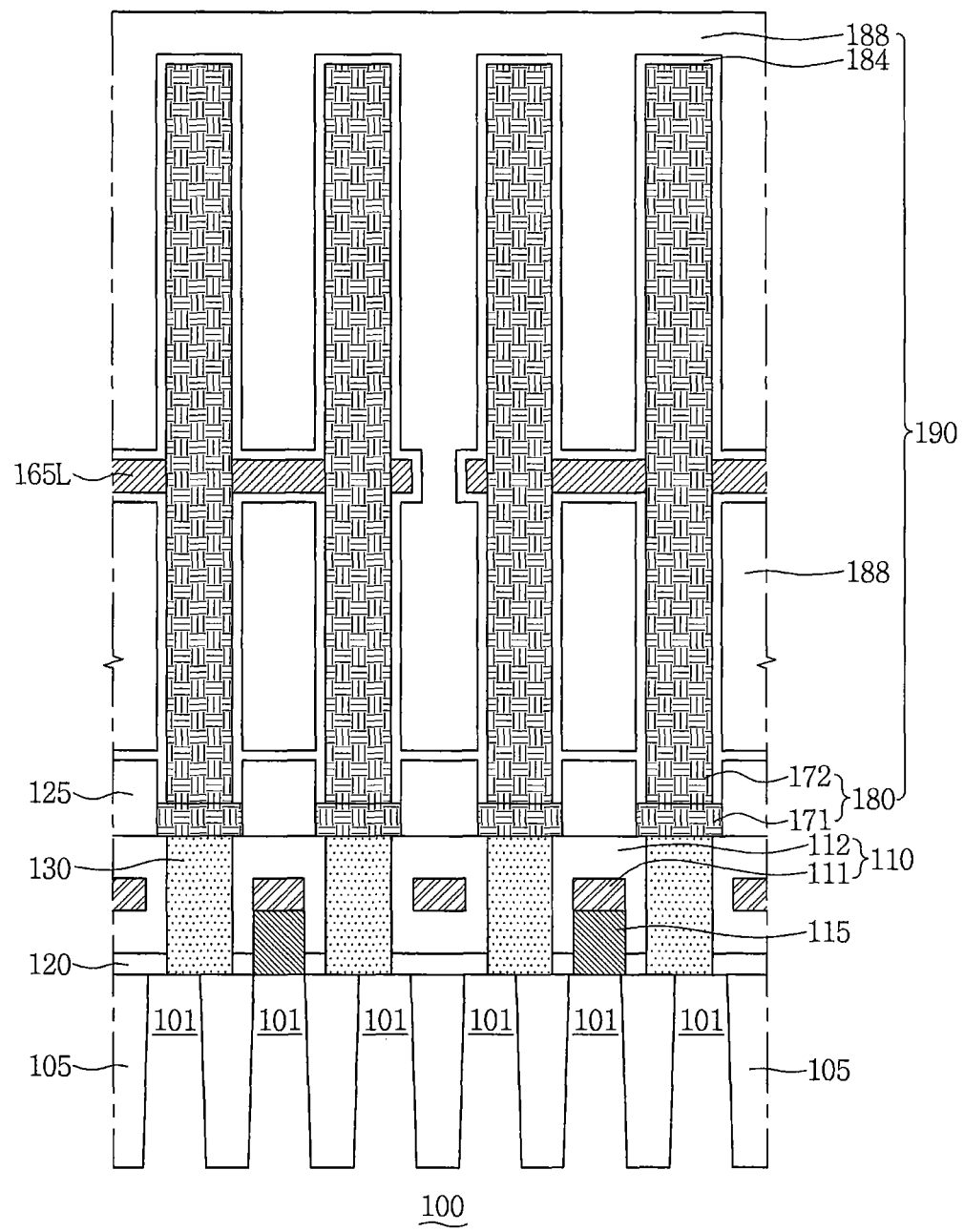

Referring to FIG. 2B, a semiconductor device 10B in accordance with various embodiments of the inventive concept may further include lower supporters 165L, compared to the semiconductor device 10A of FIG. 2A. The lower supporters 165L may be arranged in the form of a bridge physically connecting lower or intermediate portions of the main silicide patterns 172 of the storage electrodes 180 in a horizontal direction. For example, the lower supporters 165L may be in contact with side surfaces of the main silicide patterns 172 of the storage electrodes 180. The lower supporters 165L may horizontally extend to have a plate shape, a line shape, or a bar shape in a top view. The lower supporters 165L may include one of SiN, SiON, or SiCN. The main silicide patterns 172 may perpendicularly pass through the lower supporters 165L. The capacitor dielectric layer 184 may be conformally formed on outer surfaces of the lower supporters 165L, for example, upper surfaces, lower surfaces, and side surfaces of the lower supporters 165L.

Figure 2C:
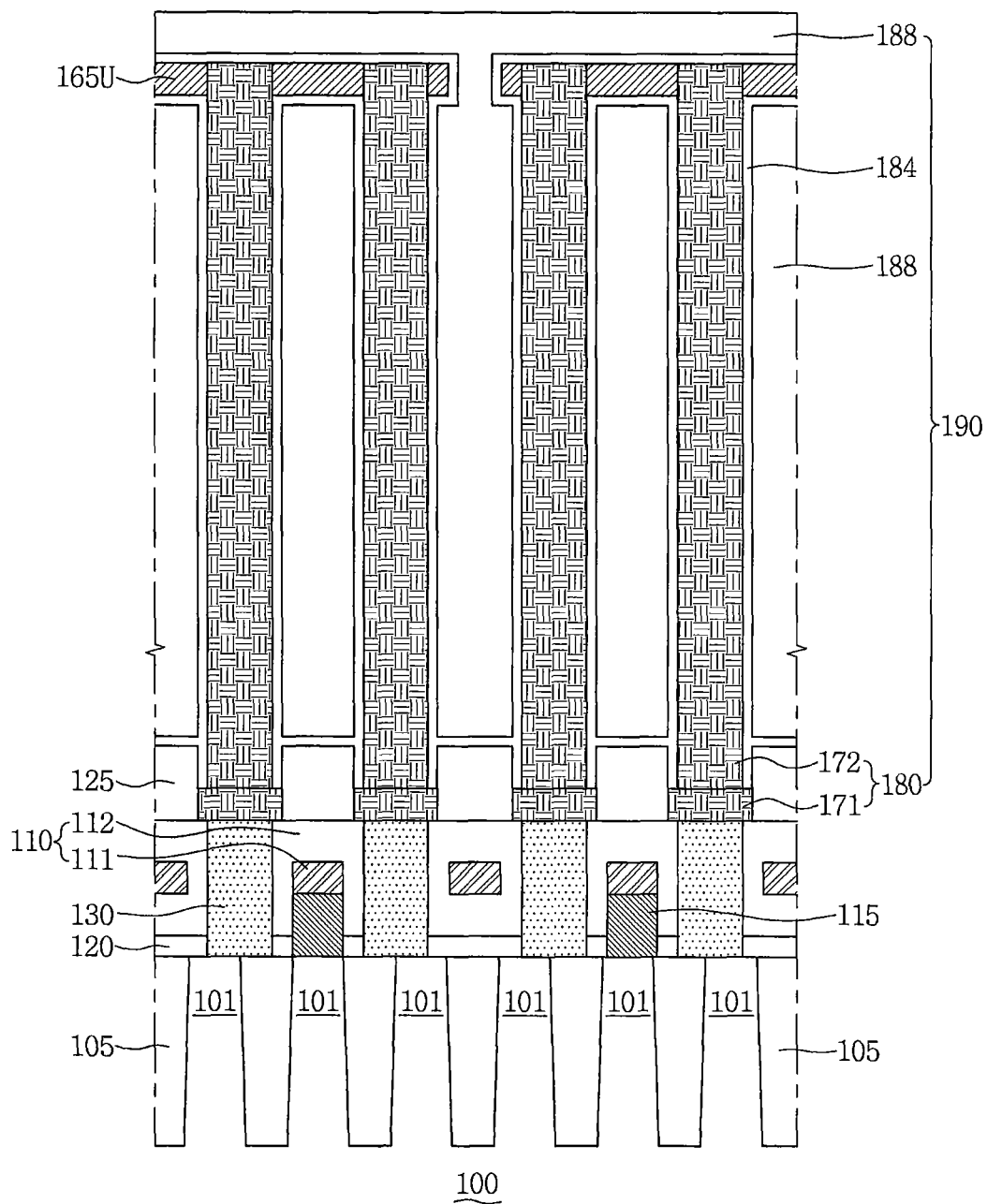

Referring to FIG. 2C, a semiconductor device 10C in accordance with various embodiments of the inventive concept may further include upper supporters 165U, compared to the semiconductor device 10A of FIG. 2A. The upper supporters 165U may be arranged in the form of a bridge horizontally connecting upper ending portions of the main silicide patterns 172 of the storage electrodes 180. For example, the upper supporters 165U may be in contact with the side surfaces of the main silicide patterns 172 of the storage electrodes 180. The upper supporters 165U may overlap the lower supporters 165L in a top view. The upper supporters 165U may include one of SiN, SiON, or SiCN. The main silicide patterns 172 may perpendicularly pass through the upper supporters 165U. Upper surfaces of the main silicide patterns 172 and upper surfaces of the upper supporters 165U may be coplanar. The capacitor dielectric layer 184 may be conformally formed on outer surfaces of the upper supporters 165U, for example, upper surfaces, lower surfaces, and side surfaces of the upper supporters 165U.

Figure 2D:
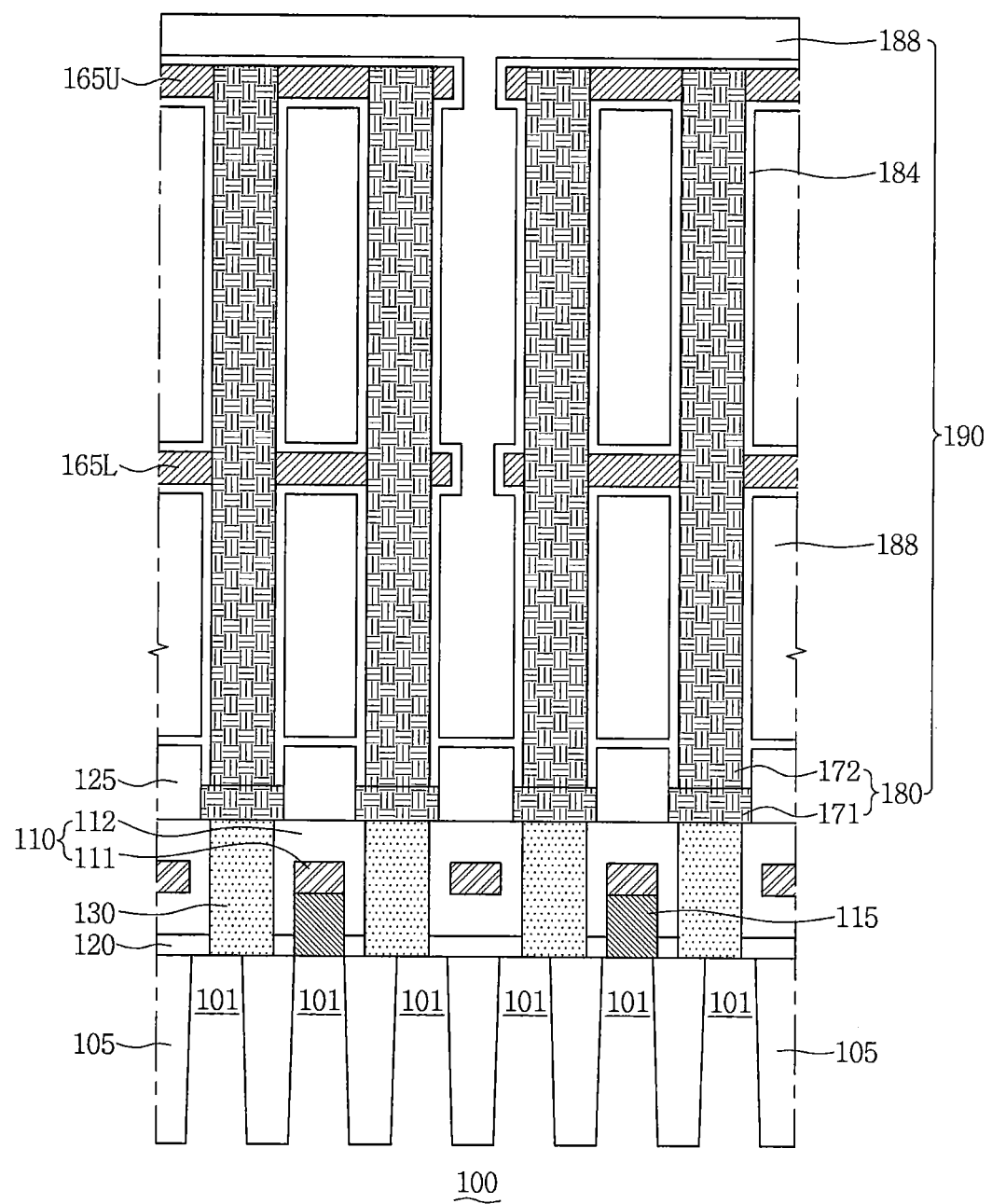

Referring to FIG. 2D, a semiconductor device 10D in accordance with various embodiments of the inventive concept may include both the lower supporters 165L and the upper supporters 165U, compared to the semiconductor devices 10A to 10C of FIGS. 2A to 2C.

Figure 2E:
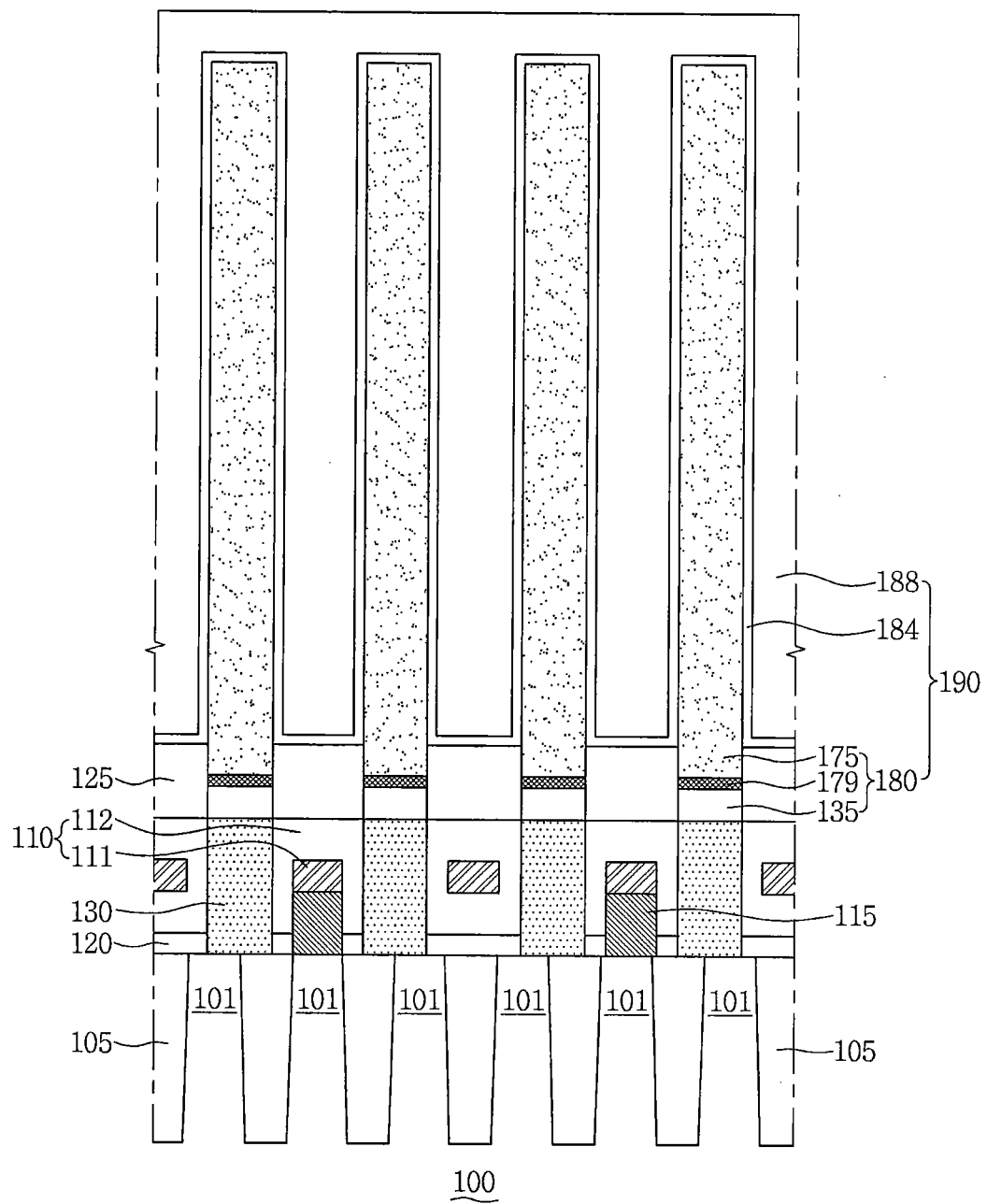

Referring to FIG. 2E, a semiconductor device 10E may include storage electrodes 180 having base patterns 135 and metal patterns 175 disposed on the base patterns 135. The metal patterns 175 may include a metal or a metal compound, such as W or TiN. The metal pattern 175 may have the same shape as the main silicide patterns 172 of FIGS. 2A to 2C. When the base patterns 135 include silicon, a barrier pattern 179 may be interposed between the base patterns 135 and the metal patterns 175. The barrier pattern 179 may include a barrier layer such as TiN.

Figure 2F:
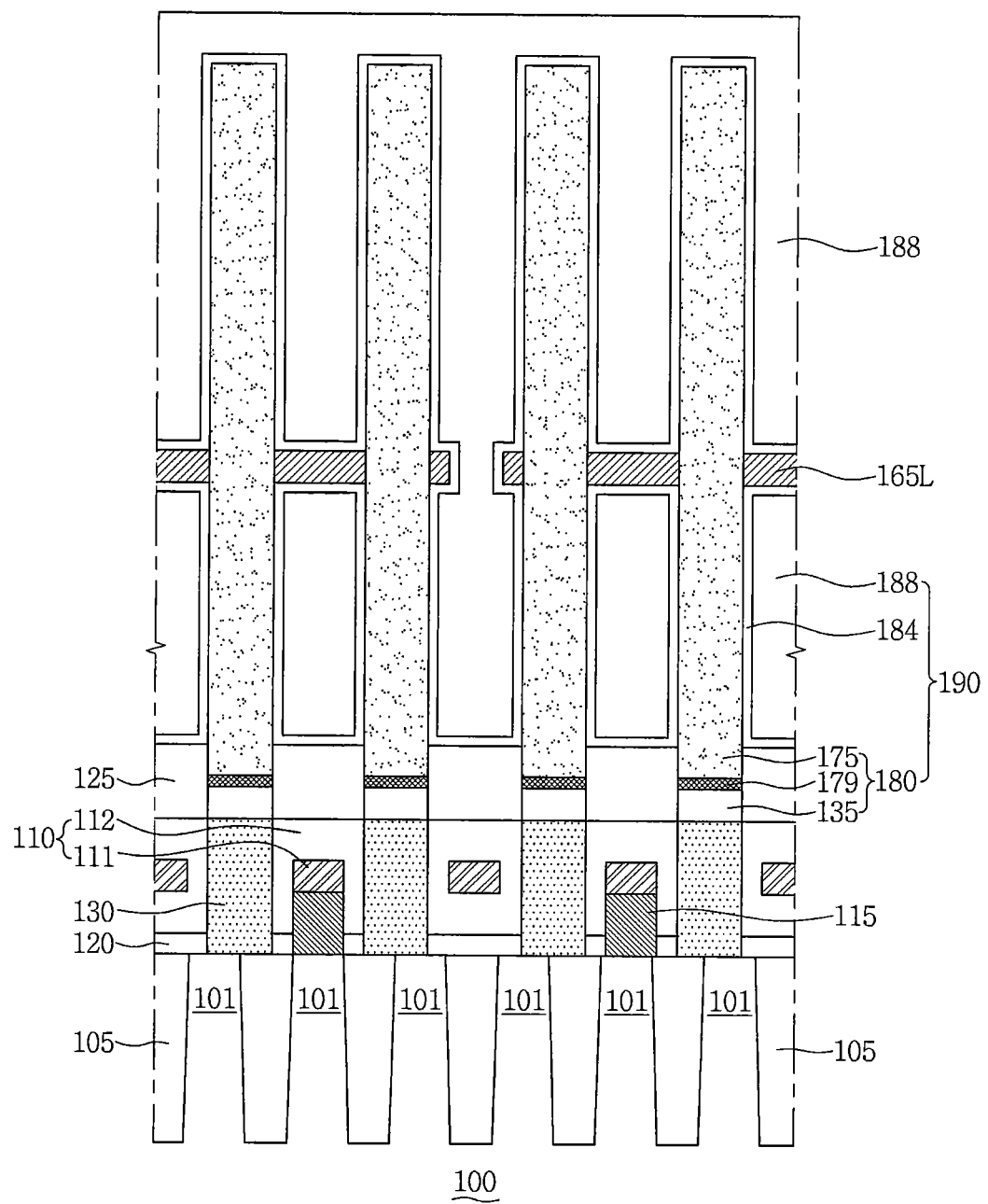

Referring to FIG. 2F, a semiconductor device 10F in accordance with various embodiments of the inventive concept may further include lower supporters 165L, compared to the semiconductor device 10E of FIG. 2E.

Figure 2G:
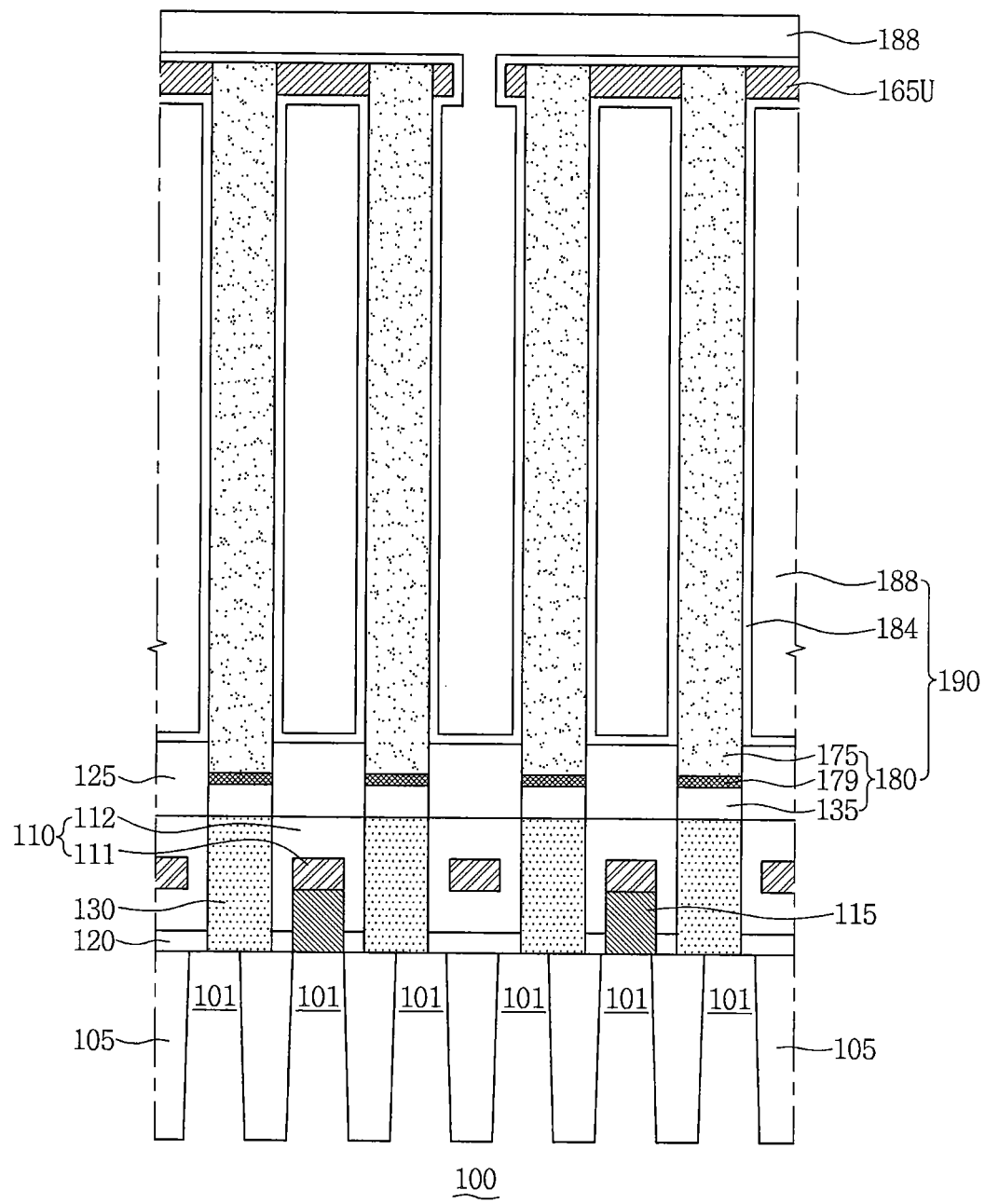

Referring to FIG. 2G, a semiconductor device 10G in accordance with various embodiments of the inventive concept may further include upper supporters 165U, compared to the semiconductor device 10E of FIG. 2E.

Figure 2H:
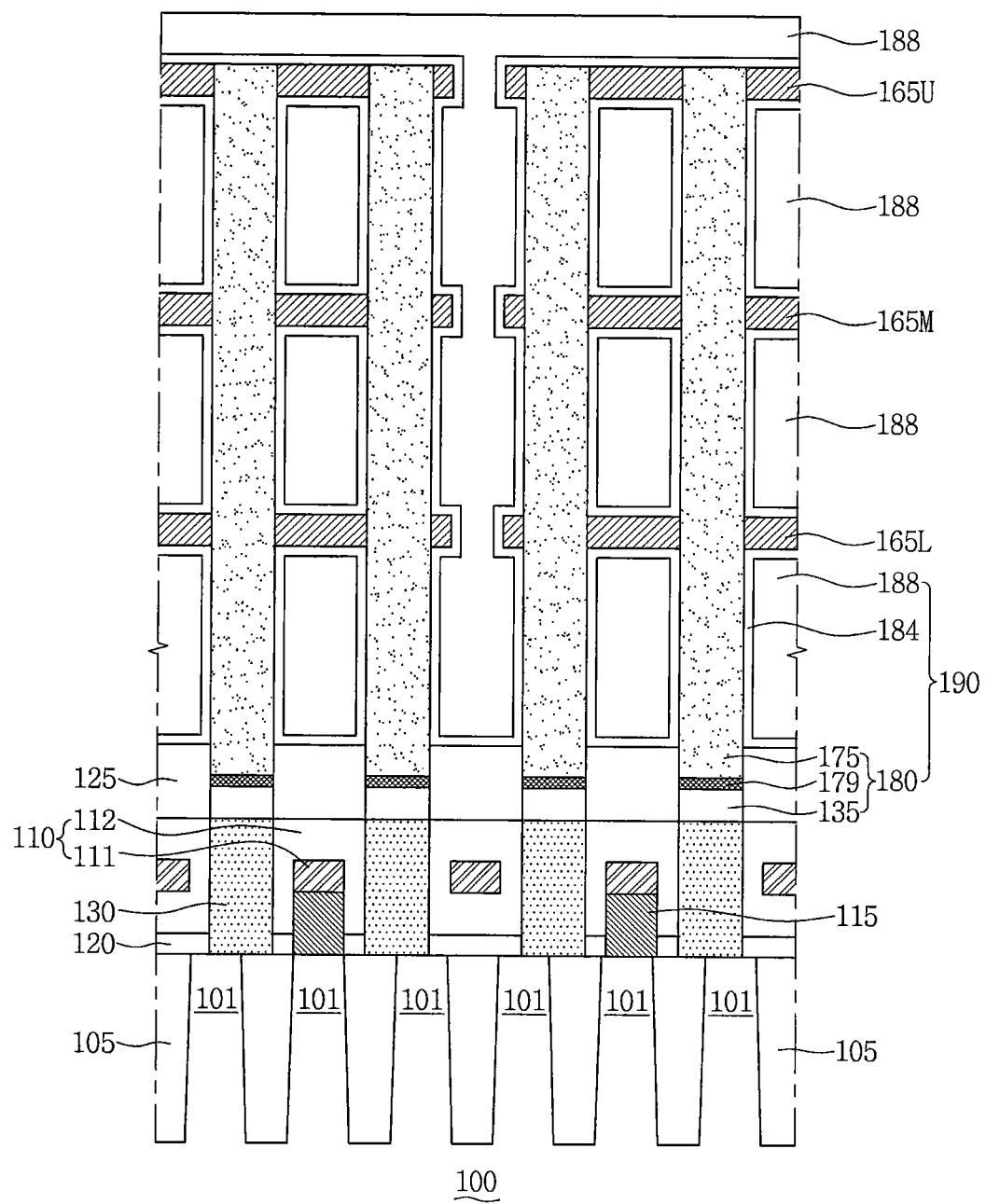

Referring to FIG. 2H, a semiconductor device 10H in accordance with various embodiments of the inventive concept may further lower supporters 165L, intermediate supporters 165M, and upper supporters 165U, with further reference to FIGS. 2E to 2G. The semiconductor device 10H may include a multilayer of supporters 165L, 165M, and 165U. At least one of the lower supporters 165L, the intermediate supporters 165M, and the upper supporters 165U may be omitted according to various embodiments.

FIGS. 3A to 3G are cross-sectional views for describing a method of fabricating a semiconductor device in accordance with various embodiments of the inventive concept.

Figure 3A:
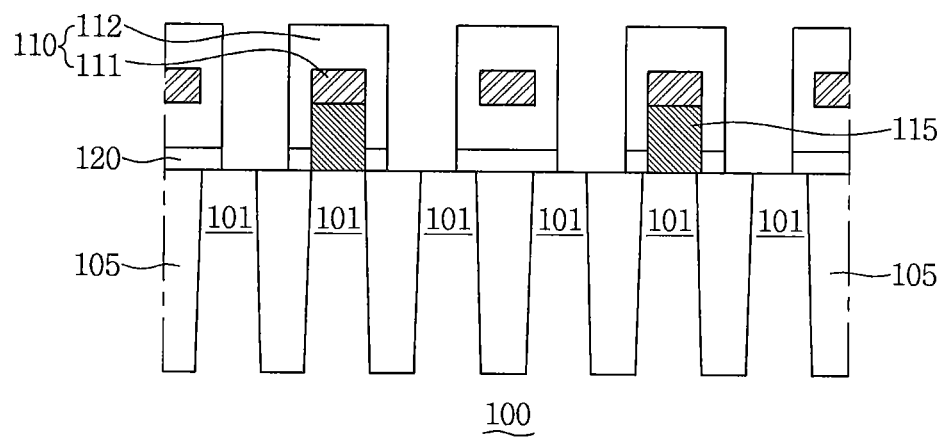
FIGS. 3A through 3G are cross-sectional views describing a method of fabricating a semiconductor device in accordance with various embodiments of the inventive concept.

Referring to FIG. 3A, a method of fabricating a semiconductor device includes forming device isolation regions 105 defining active regions 101 in a substrate 100, forming an interlayer insulating layer 120 on the substrate 100, and forming bit line structures 110 on the interlayer insulating layer 120. The substrate 100 may include a silicon wafer. The active regions 101 may include source/drain regions. The device isolation regions 105 may include STIs. The interlayer insulating layer 120 may include SiN or $SiO_2$. Each of the bit line structures 110 may include a bit line electrode 111 and a bit line insulating layer 112. The bit line insulating layer 112 may cover an upper surface and side surfaces of the bit line electrode 111. The bit line electrode 111 may include a conductive material, such as a metal, a metal silicide, or a metal compound, and the bit line insulating layer 112 may include silicon nitride.

The method may further include forming bit line contacts 115 passing through the interlayer insulating layer 120 to be in contact with the active regions 101 and the bit line electrodes 111. The bit line contacts 115 may include one of doped silicon, a metal, a metal silicide, or a metal compound.

Figure 3B:
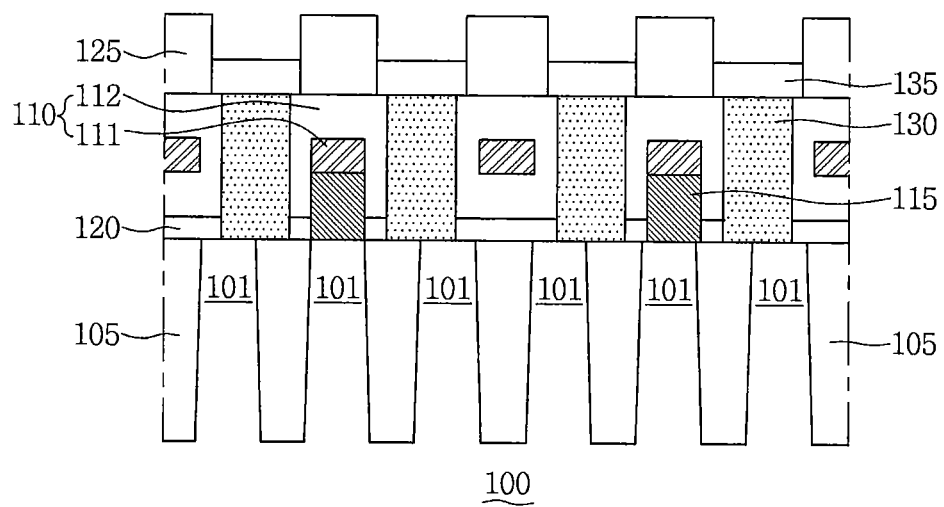

Referring to FIG. 3B, the method may include forming guide patterns 125, contact pads 130, and base patterns 135.

The guide patterns 125 may be formed on the bit line insulating layers 112, in the shape of a mesh defining regions in which the contact pads 130 and the base patterns 135 are to be formed. The guide patterns 125 may include silicon nitride.

The contact pads 130 may be formed to be in contact with the active regions 101 disposed between the bit line structures 110. The contact pads 130 may include doped single-crystalline silicon, doped poly-crystalline silicon, a metal, a metal silicide, or a metal compound.

The base patterns 135 may be disposed on the contact pads 130 between the guide patterns 125. Upper surfaces of the base patterns 135 may be recessed to be lower than upper surfaces of the guide patterns 125. The base patterns 135 may include poly-crystalline silicon.

Figure 3C:
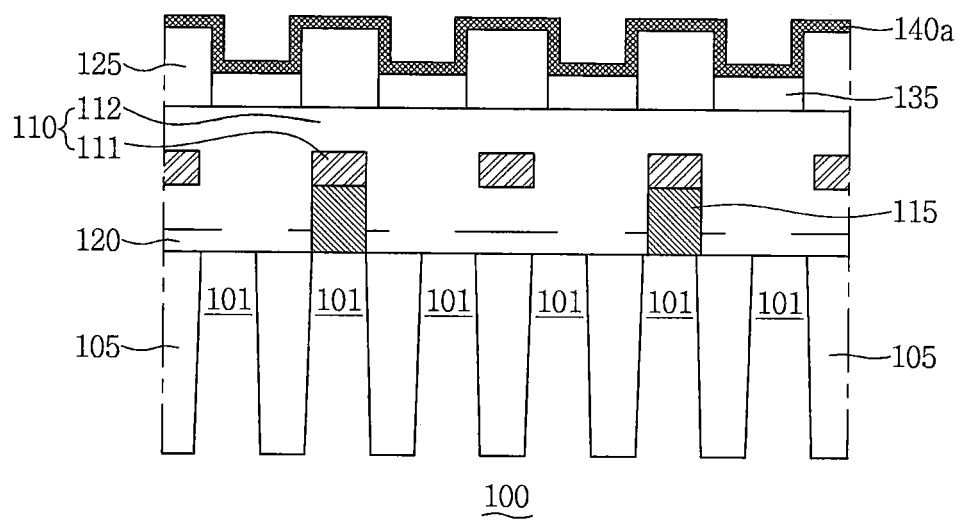

Referring to FIG. 3C, the method may include conformally forming a metal catalyst layer 140a on the base patterns 135 and the guide patterns 125. The metal catalyst layer 140a may include a silicon solid-soluble metal, such as gold (Au), aluminum (Al), nickel (Ni), tungsten (W), titanium (Ti), or cobalt (Co).

Figure 3D:
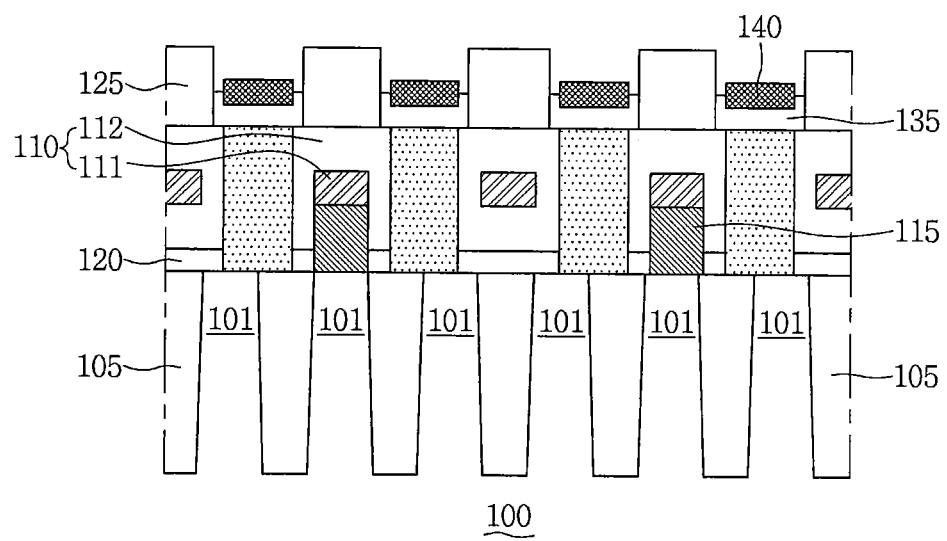

Referring to FIG. 3D, the method may include forming catalyst patterns 140 on the base patterns 135. The catalyst patterns 140 may be formed by annealing the metal catalyst layer 140a. The remaining metal catalyst layer 140a may be removed in various embodiments.

Figure 3E:
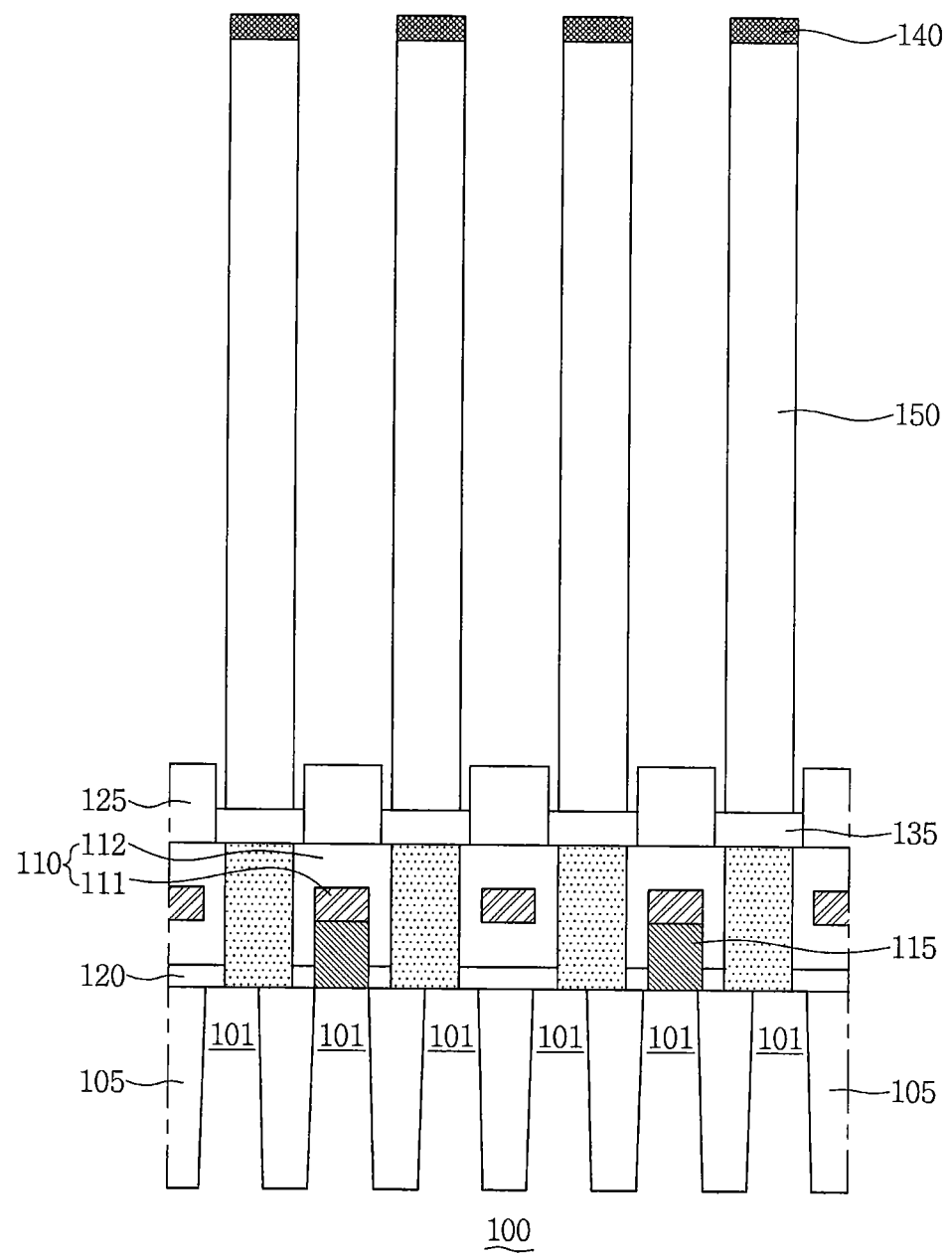

Referring to FIG. 3E, the method may include forming silicon nanowires 150 on the base patterns 135. The silicon nanowires 150 may be formed by performing a nanowire growth process using the catalyst patterns 140 as seeds. The nanowire growth process may include a CVD process using a $SiH_4$ gas. The catalyst patterns 140 may be located at the uppermost of the silicon nanowires 150.

Figure 3F:
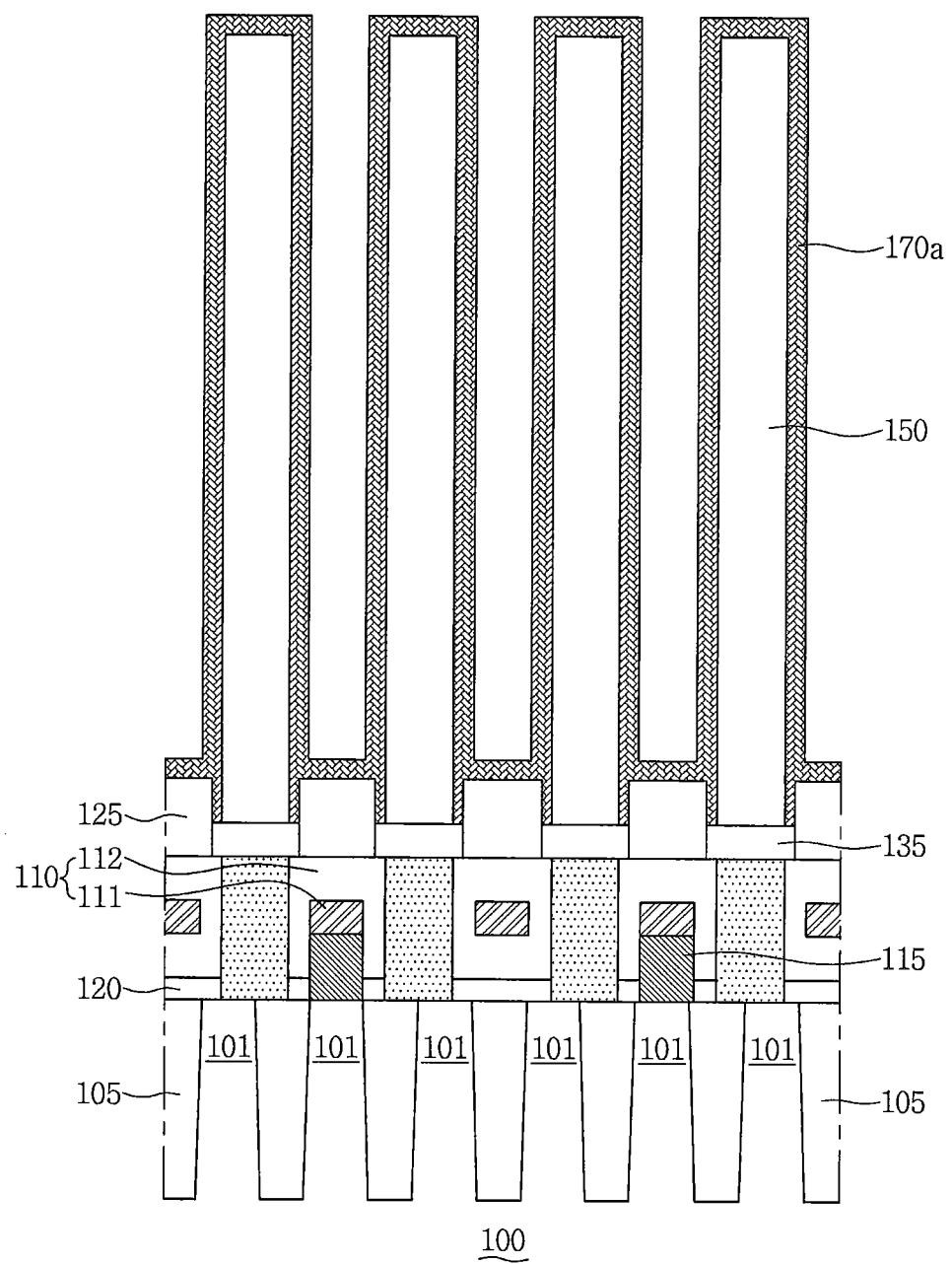

Referring to FIG. 3F, the method may include removing the catalyst patterns 140, and conformally forming a silicide-forming metal layer 170a on surfaces of the silicon nanowires 150. The catalyst patterns 140 may be removed by a wet etching method using a mixture of sulfate, nitrate, hydrochloric acid, or a citric acid. The catalyst patterns 140 may remain without being removed. The remaining catalyst patterns 140 may be removed using another process. The silicide-forming metal layer 170a may include one of Ni, W, Ti, or Co.

Figure 3G:
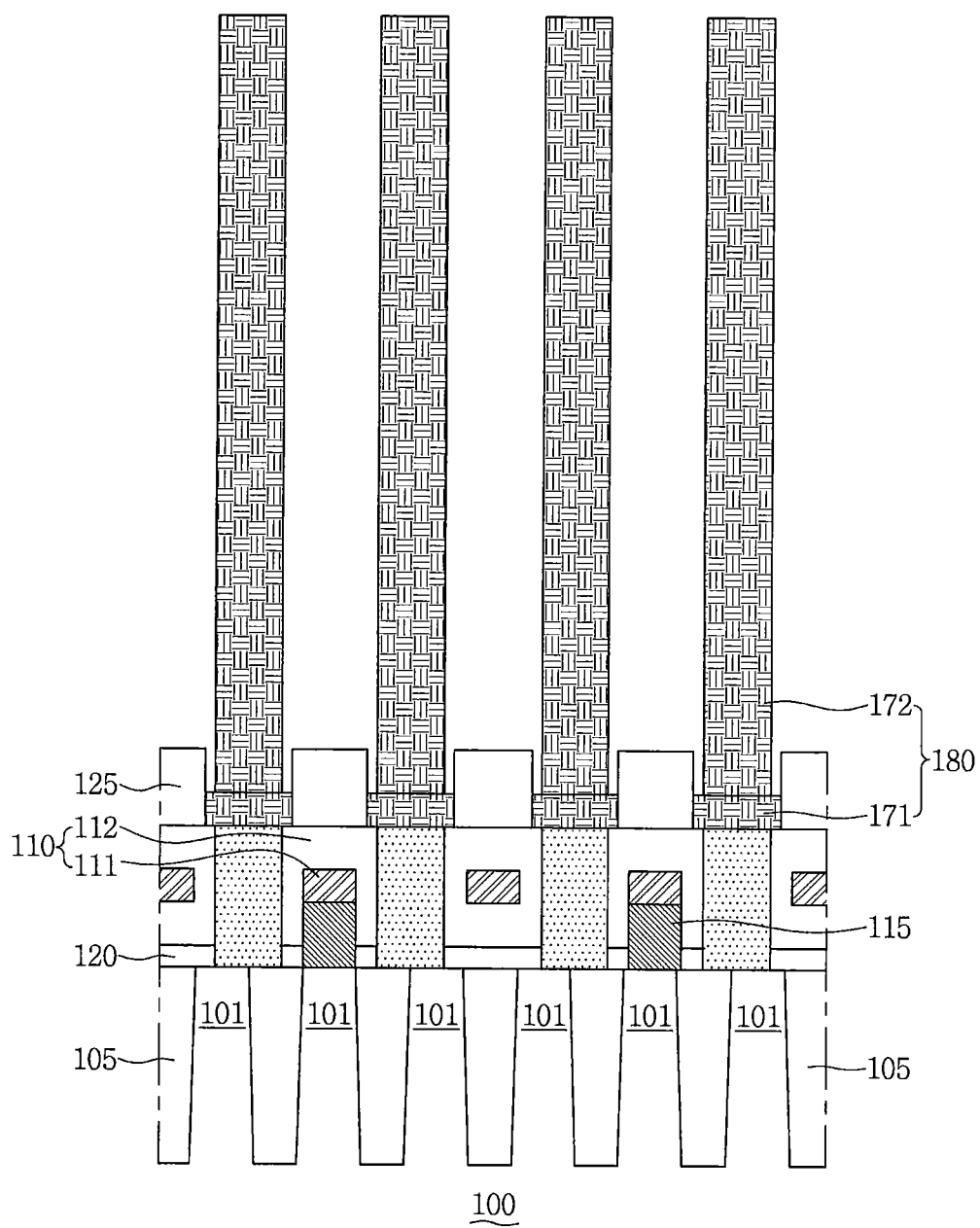

Referring to FIG. 3G, the method may include forming storage electrodes 180 including base silicide patterns 171 and main silicide patterns 172. The base silicide patterns 171 may be formed by the base patterns 135 being silicided, and the main silicide patterns 172 may be formed by the silicon nanowires 150 being silicided. The remaining silicide-forming metal layer 170a may be removed. When the catalyst patterns 140 remain, the remaining catalyst patterns 140 may be removed in this process.

Referring to FIG. 2A, the method may include conformally forming a capacitor dielectric layer 184 on the storage electrodes 180 and forming a plate electrode 188 on the capacitor dielectric layer 184. Thus, capacitor structures 190 may be formed. The capacitor dielectric layer 184 may include hafnium oxide (HfO) or titanium oxide (TiO).

FIGS. 4A to 4F are cross-sectional views for describing a method of fabricating a semiconductor device in accordance with various embodiments of the inventive concept.

Figure 4A:
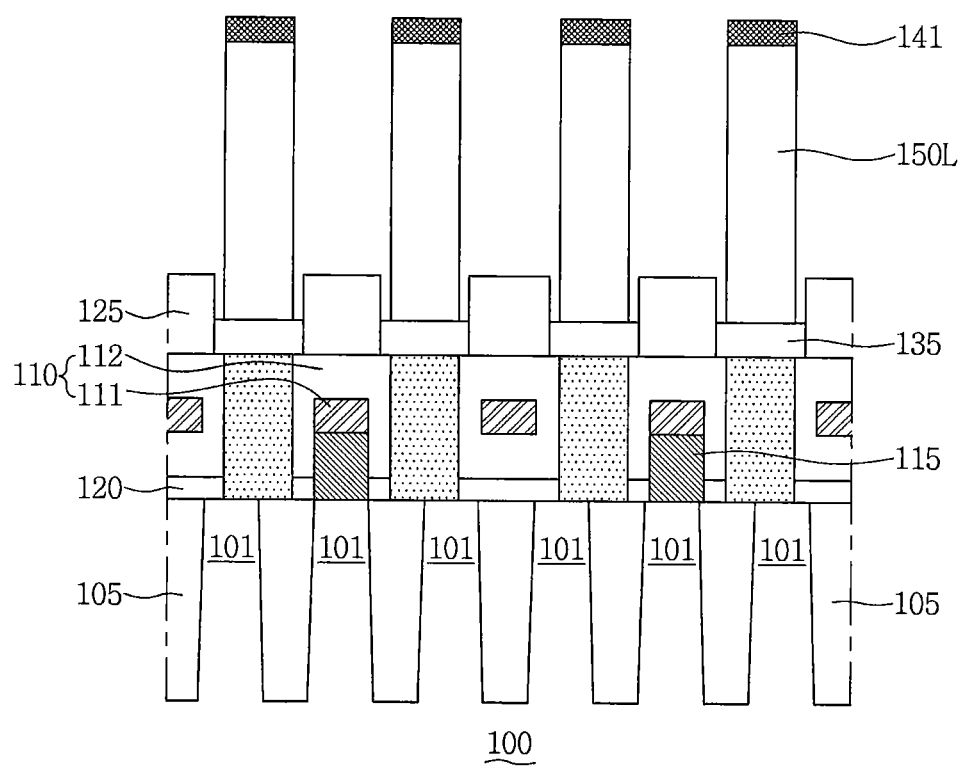
FIGS. 4A through 4F are cross-sectional views describing a method of fabricating a semiconductor device in accordance with various embodiments of the inventive concept.

Referring to FIG. 4A, the method of fabricating a semiconductor device in accordance with the embodiment of the inventive concept may include forming lower silicon nanowires 150L by performing the processes described with reference to FIGS. 3A to 3E. First catalyst patterns 141 may exist on the lower silicon nanowires 150L according to various embodiments.

Figure 4B:
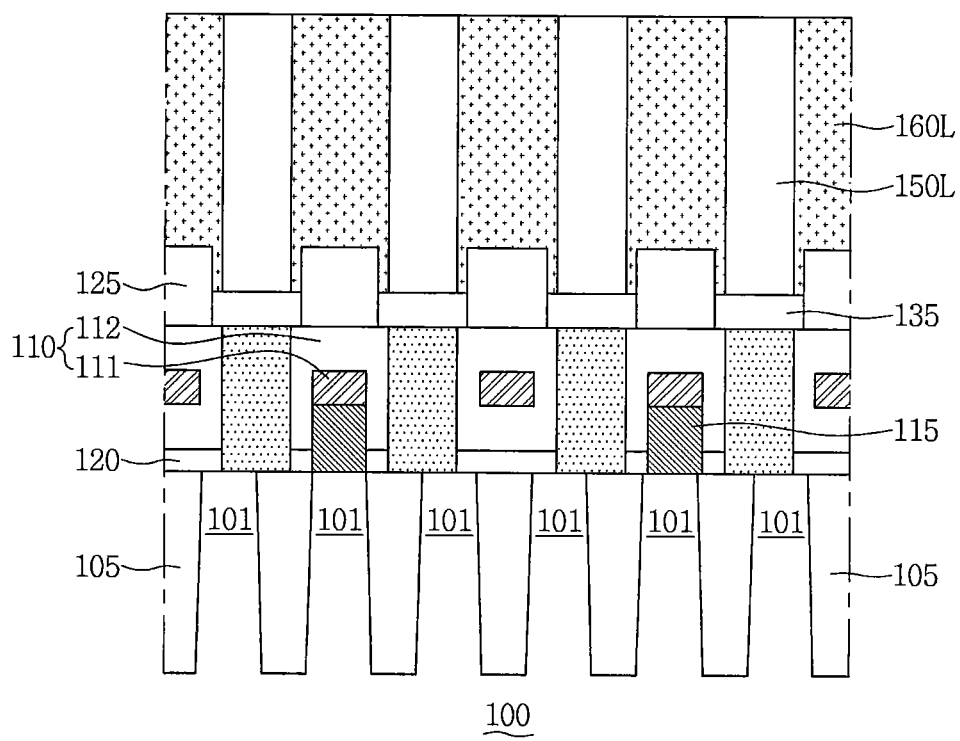

Referring to FIG. 4B, the method may include forming a lower molding insulating layer 160L between the lower silicon nanowires 150L, and planarizing an upper surface of the lower molding insulating layer 160L and upper surfaces of the lower silicon nanowires 150L by performing a CMP process. In some embodiments, the lower molding insulating layer 160L may fill spaces between the lower silicon nanowires 150L. The first catalyst patterns 141 may be removed according to various embodiments. The lower molding insulating layer 160L may include an insulating material such as silicon oxide.

Figure 4C:
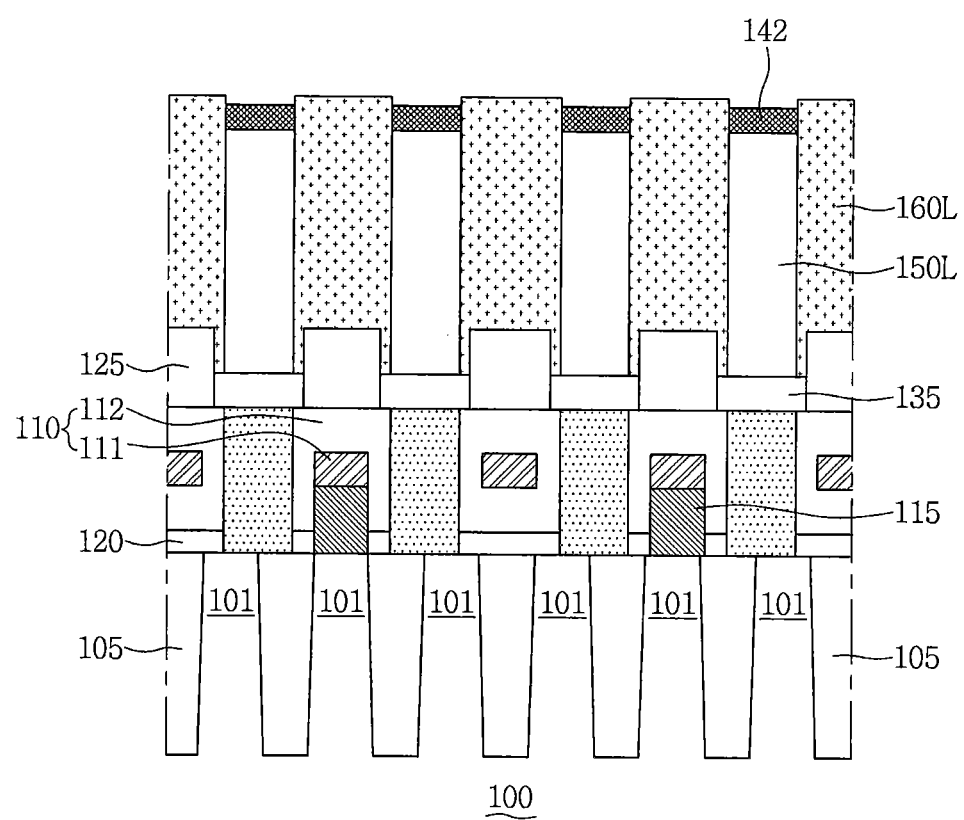

Referring to FIG. 4C, the method may include recessing the upper surfaces of the lower silicon nanowires 150L and forming second catalyst patterns 142 on the recessed upper surfaces of the lower silicon nanowires 150L.

Figure 4D:
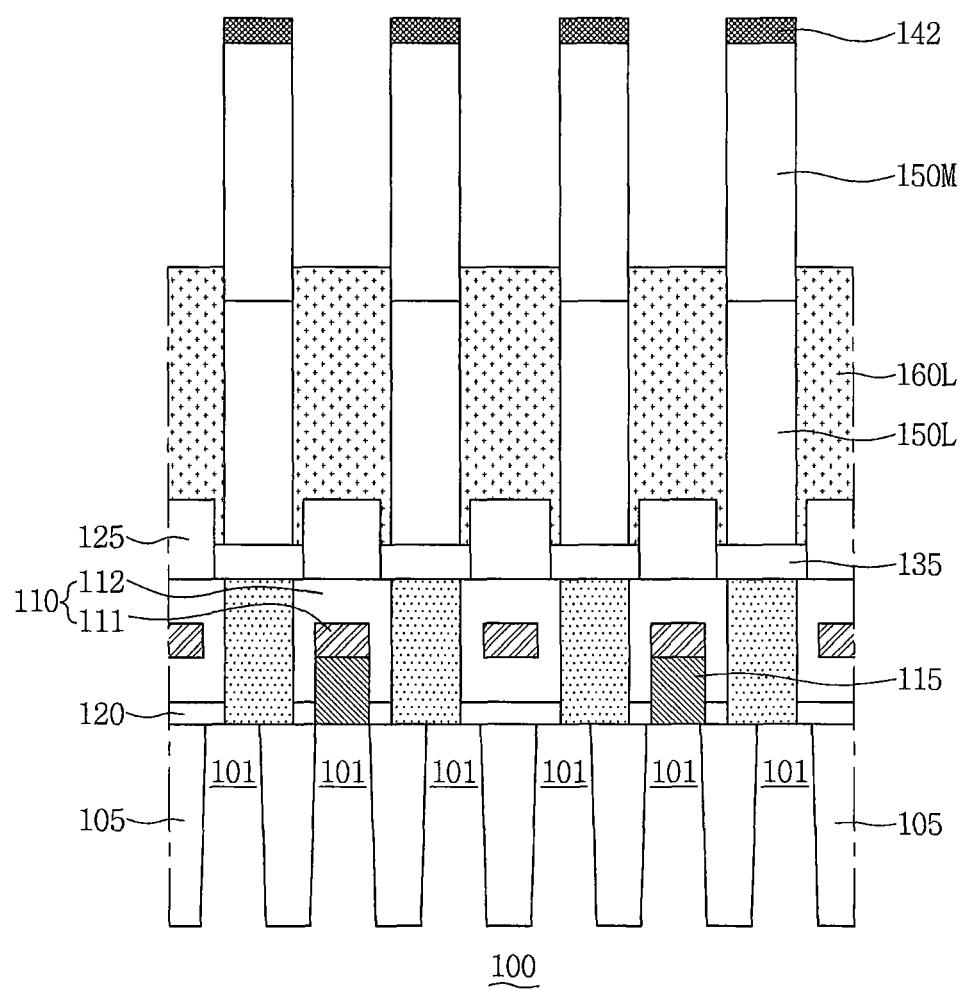

Referring to FIG. 4D, the method may include forming intermediate silicon nanowires 150M by performing a nanowire growth process using the second catalyst patterns 142 as seeds and the lower molding insulating layer 160L as a guide. The second catalyst patterns 142 may remain on the intermediate silicon nanowires 150M.

Figure 4E:
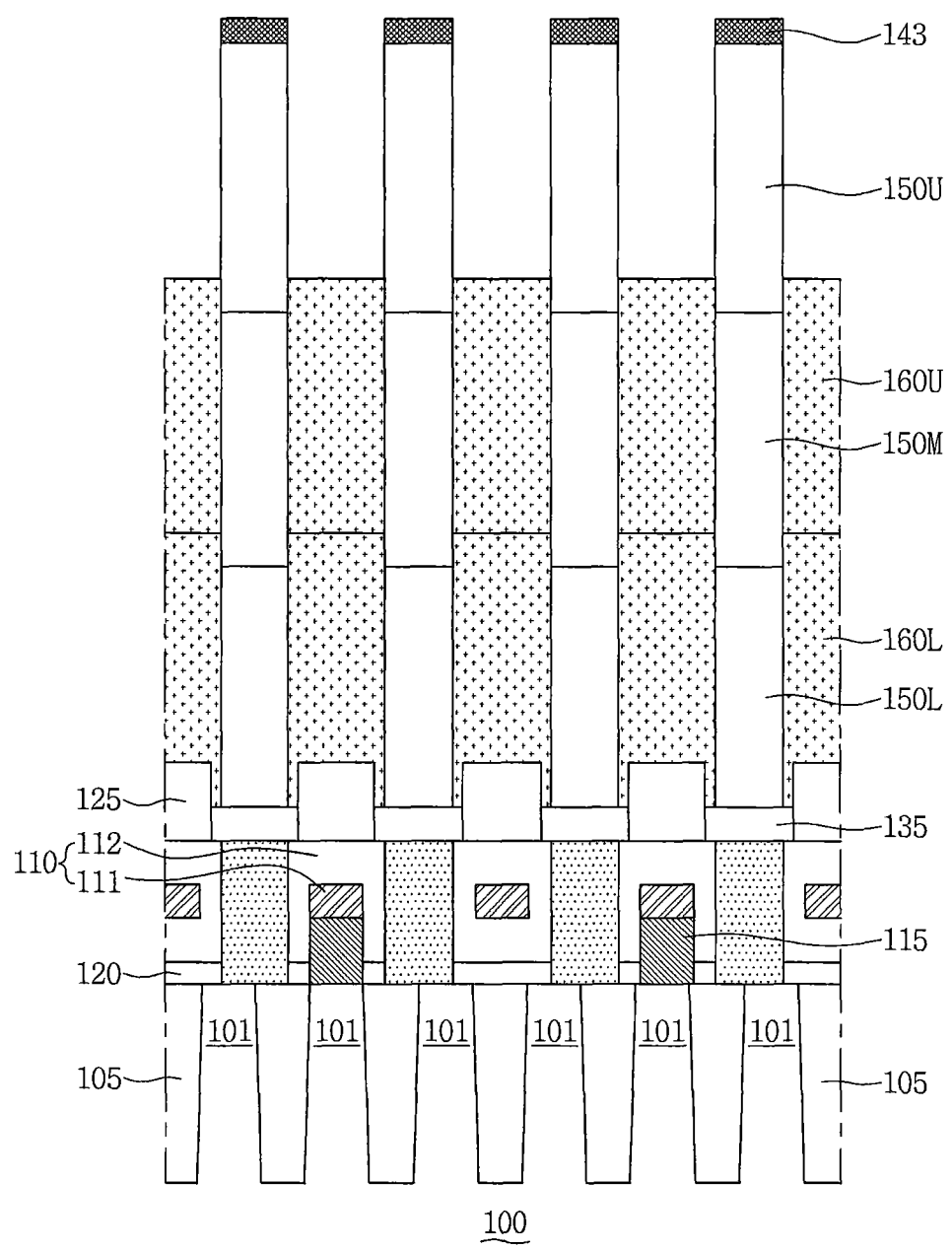

Referring to FIG. 4E, the method may include forming an upper molding insulating layer 160U surrounding the intermediate silicon nanowires 150M by performing the processes described with reference to FIGS. 4B to 4E, removing the second catalyst patterns 142 and planarizing upper surfaces of the intermediate silicon nanowires 150M and an upper surface of the upper molding insulating layer 160U by performing a planarization process, recessing the upper surfaces of the intermediate silicon nanowires 150M, forming third catalyst patterns 143 on the recessed upper surfaces of the intermediate silicon nanowires 150M, and forming upper silicon nanowires 150U by performing a nanowire growth process using the third catalyst patterns 143 as seeds and the upper molding insulating layer 160U as a guide. The third catalyst patterns 143 on the upper silicon nanowires 150U may be removed.

Figure 4F:
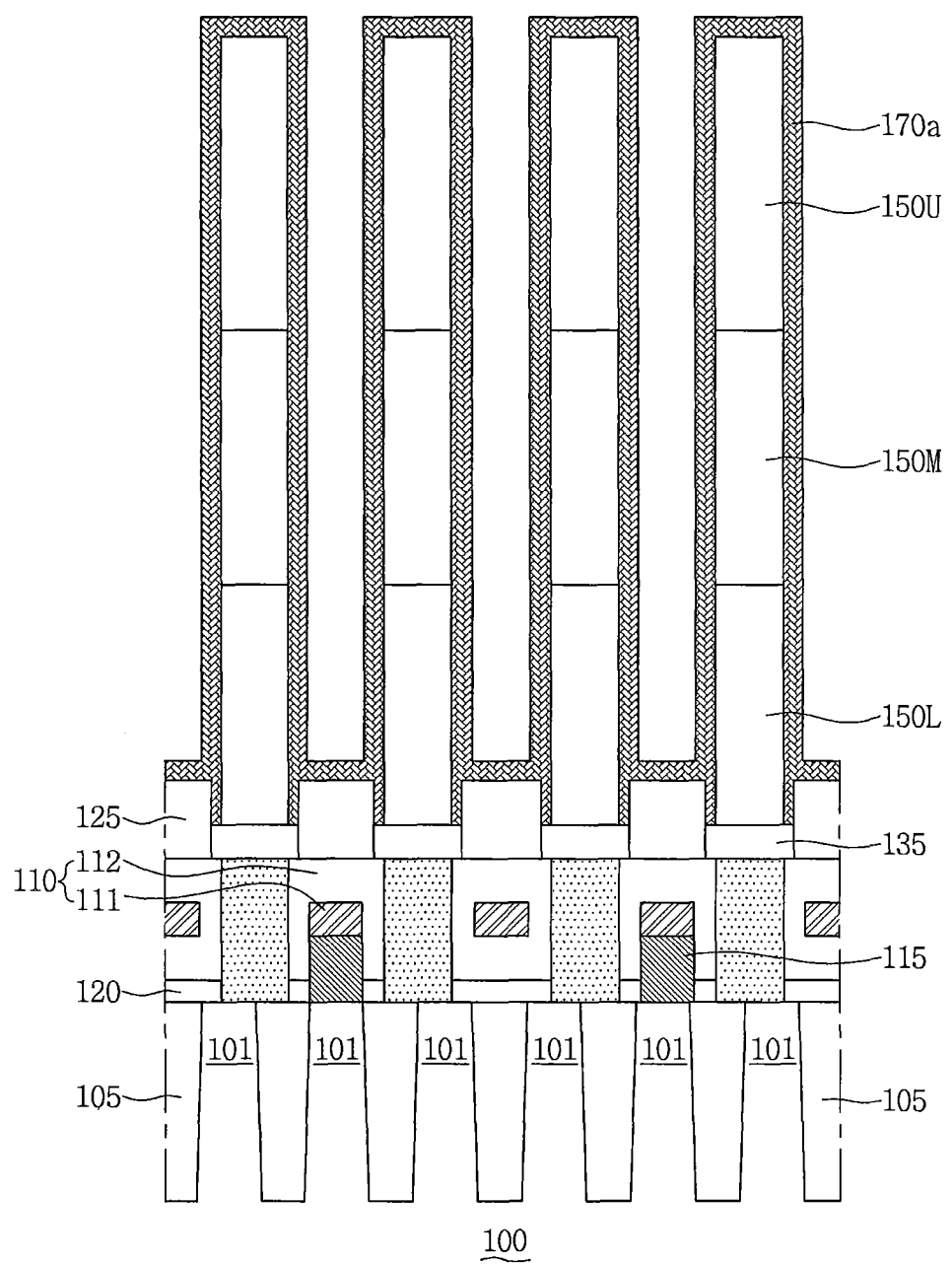

Referring to FIG. 4F, the method may include removing the upper molding insulating layer 160U and the lower molding insulating layer 160L, and forming a silicide-forming metal layer 170a on surfaces of the lower silicon nanowires 150L and the upper silicon nanowires 150U.

In various embodiments described with reference to FIG. 3G, storage electrodes 180 including base silicide patterns 171 and main silicide patterns 172 are formed by siliciding the base patterns 135, the lower silicon nanowires 150L, the intermediate silicon nanowires 150M, and the upper silicon nanowires 150U, and a capacitor dielectric layer 184 and a plate electrode 188 are formed on the storage electrodes 180, with further reference to FIG. 2A, Thus, capacitor structures 190 may be formed.

FIGS. 5A to 5J are cross-sectional views for describing a method of fabricating a semiconductor device in accordance with various embodiments of the inventive concept.

Figure 5A:
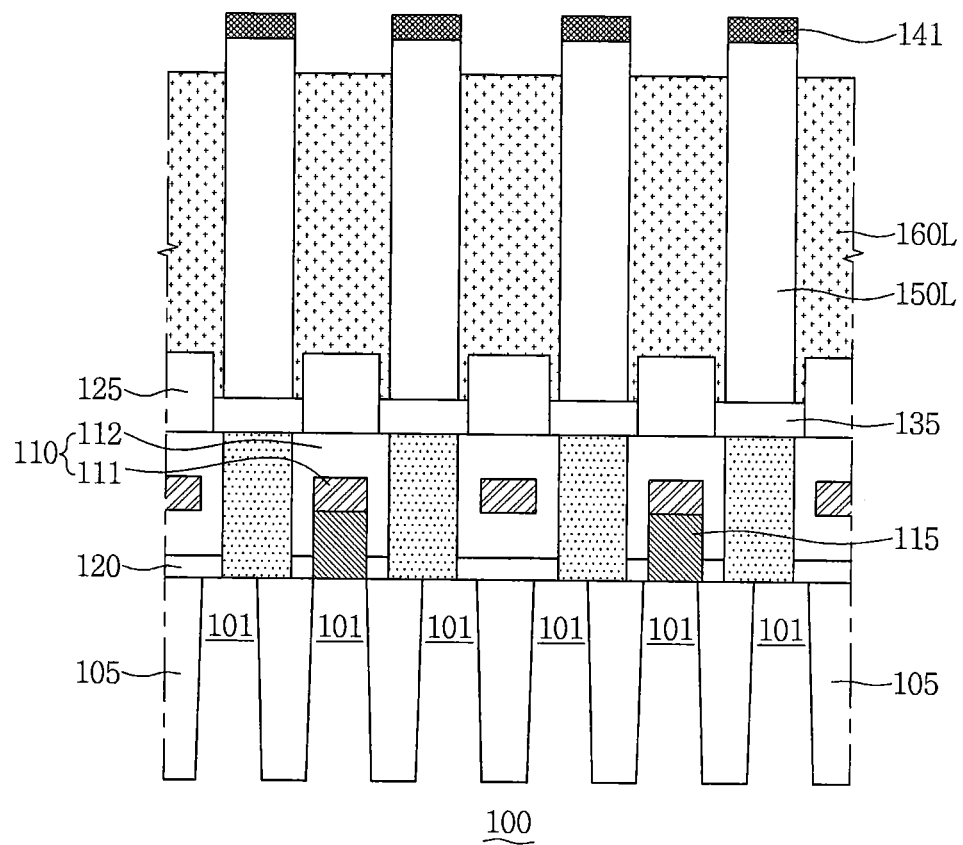
FIGS. 5A through 5J are cross-sectional views describing a method of fabricating a semiconductor device in accordance with various embodiments of the inventive concept.

Referring to FIG. 5A, the method of fabricating a semiconductor device in accordance with the embodiment of the inventive concept may include forming lower silicon nanowires 150L by performing the processes described with reference to FIGS. 3A to 3E, forming a lower molding insulating layer 160L between the lower silicon nanowires 150L, and recessing an upper surface of the lower molding insulating layer 160L. In some embodiments, the lower molding insulating layer 160L may fill spaces between the lower silicon nanowires 150L. First catalyst patterns 141 may remain on the lower silicon nanowires 150L.

Figure 5B:
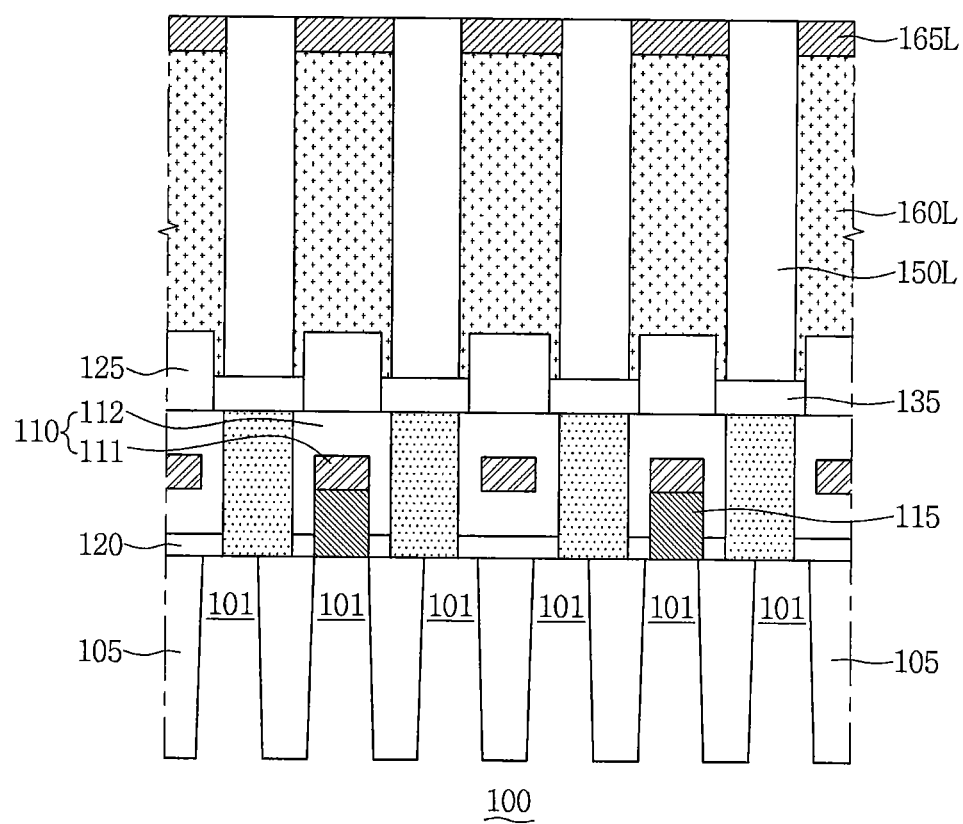

Referring to FIG. 5B, the method may include forming lower supporters 165L surrounding side surfaces of upper ending portions of the lower silicon nanowires 150L on the lower molding insulating layer 160L. The method may include performing a planarization process to remove the first catalyst patterns 141 and planarize upper surfaces of the lower silicon nanowires 150L and upper surfaces of the lower supporters 165L such that the upper surfaces of the lower silicon nanowires 150L and the upper surfaces of the lower supporters 165L are coplanar.

Figure 5C:
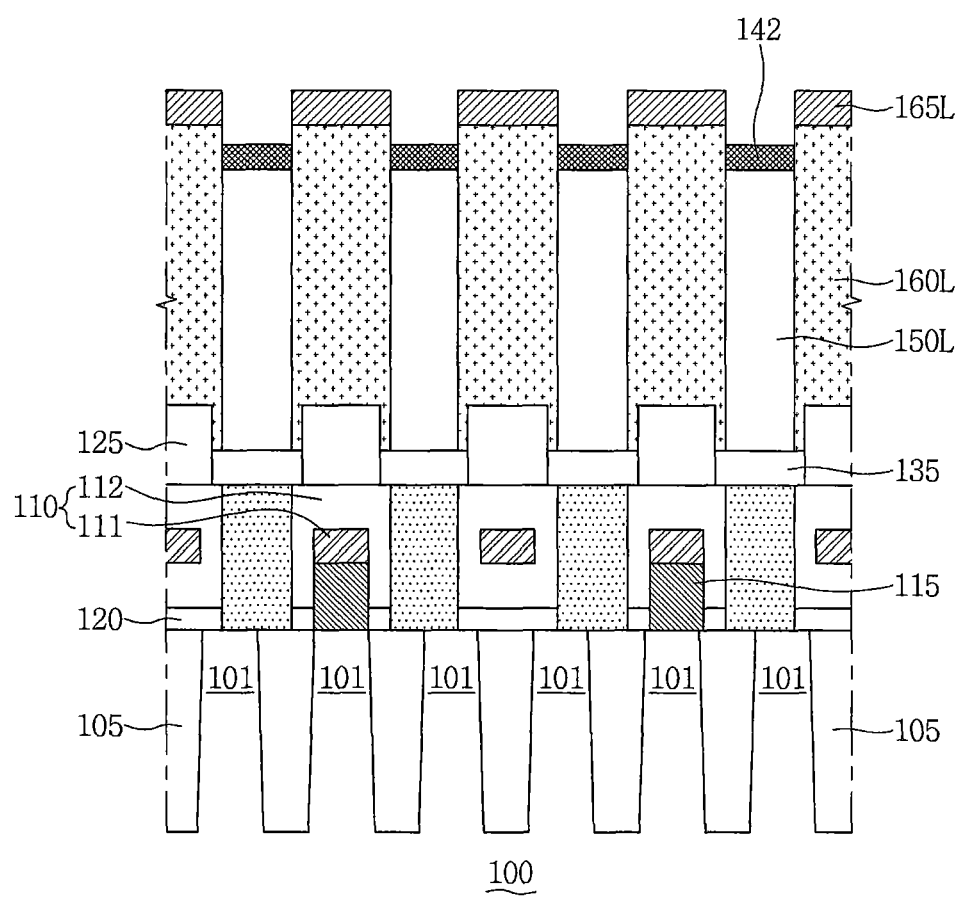

Referring to FIG. 5C, the method may include recessing the upper surfaces of the lower silicon nanowires 150L and forming second catalyst patterns 142 on the recessed upper surfaces of the lower silicon nanowires 150L.

Figure 5D:
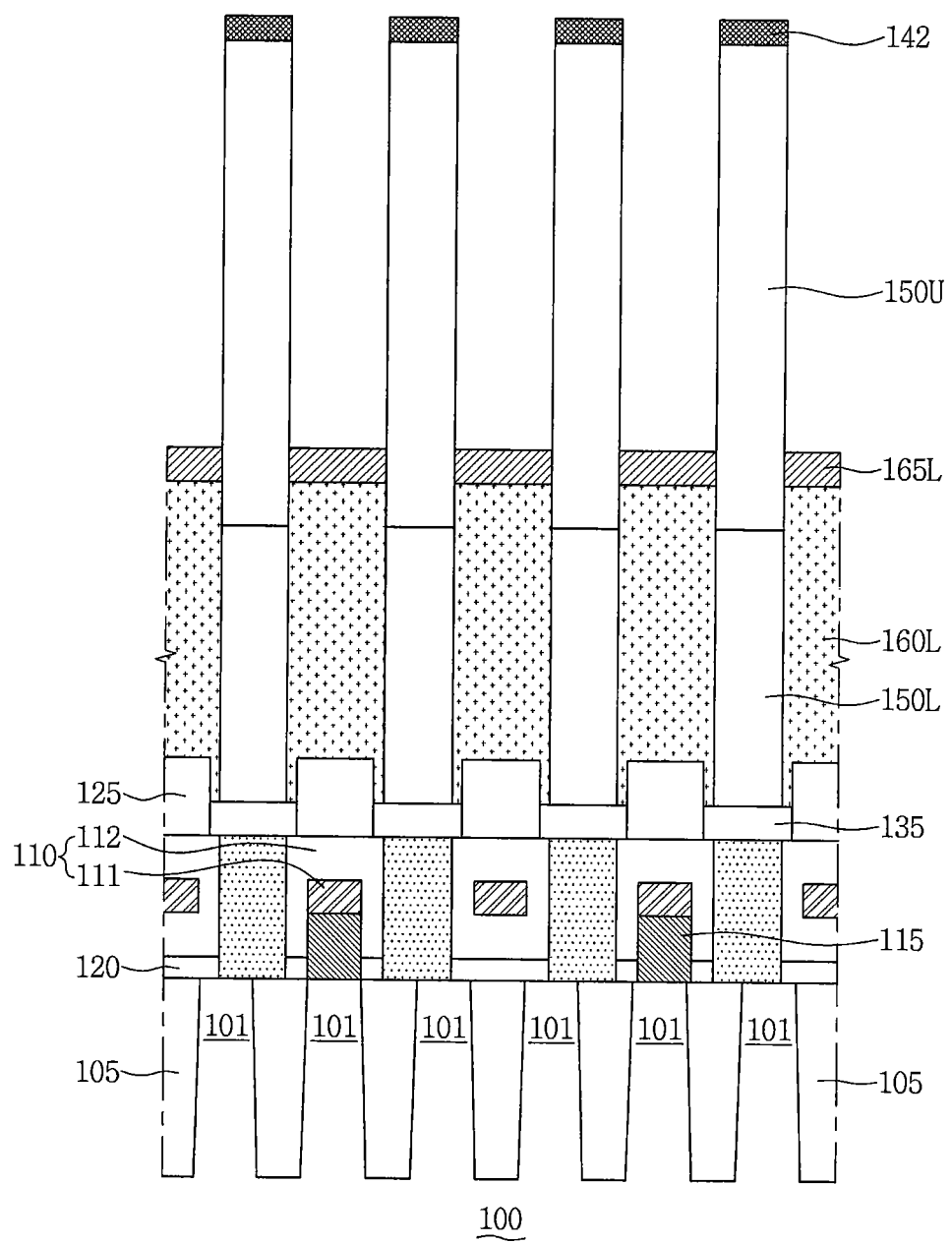

Referring to FIG. 5D, the method may include forming upper silicon nanowires 150U by performing a nanowire growth process using the second catalyst patterns 142 as seeds and the lower supporters 165L as guides. The second catalyst patterns 142 may remain on the upper silicon nanowires 150U.

Figure 5E:
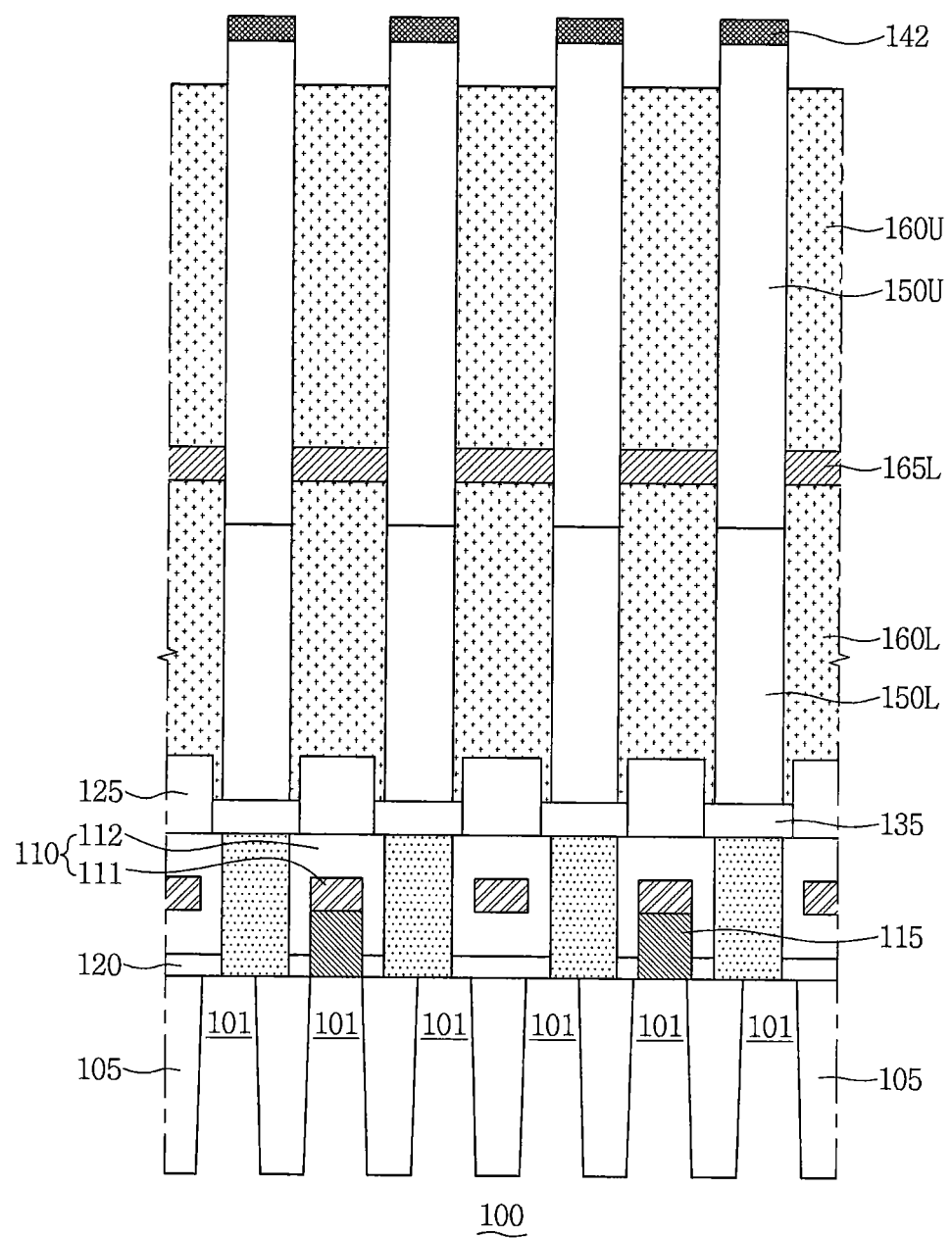

Referring to FIG. 5E, the method may include forming an upper molding insulating layer 160U between the upper silicon nanowires 150U on the lower supporters 165L, and recessing an upper surface of the upper molding insulating layer 160U.

Figure 5F:
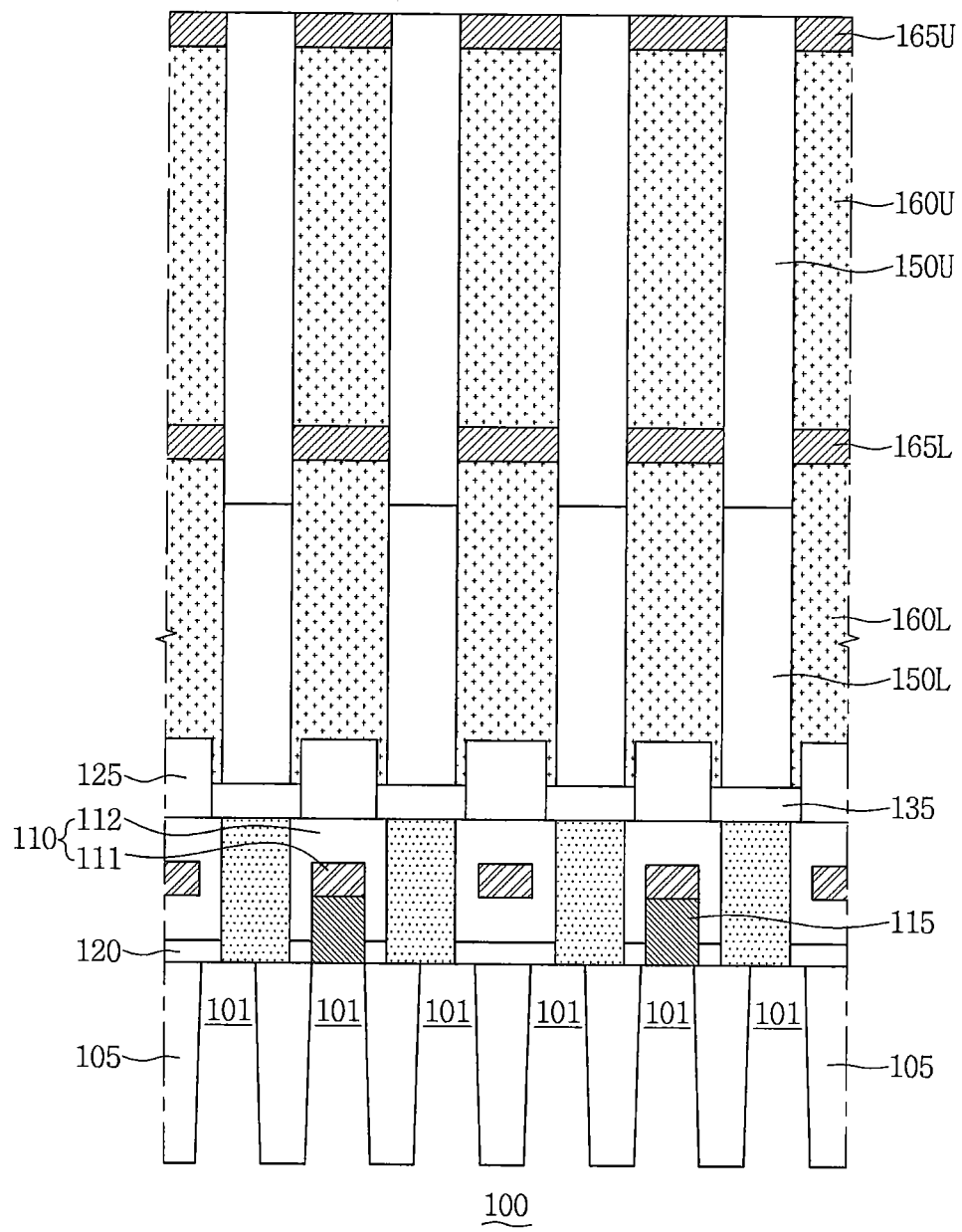

Referring to FIG. 5F, the method may include forming upper supporters 165U surrounding side surfaces of upper ending portions of the upper silicon nanowires 150U on the recessed upper surface of the upper molding insulating layer 160U. The method may include performing a planarization process to remove the second catalyst patterns 142 and planarize upper surfaces of the upper silicon nanowires 150U and upper surfaces of the upper supporters 165U such that the upper surfaces of the upper silicon nanowires 150U and the upper surfaces of the upper supporters 165U are coplanar.

Figure 5G:
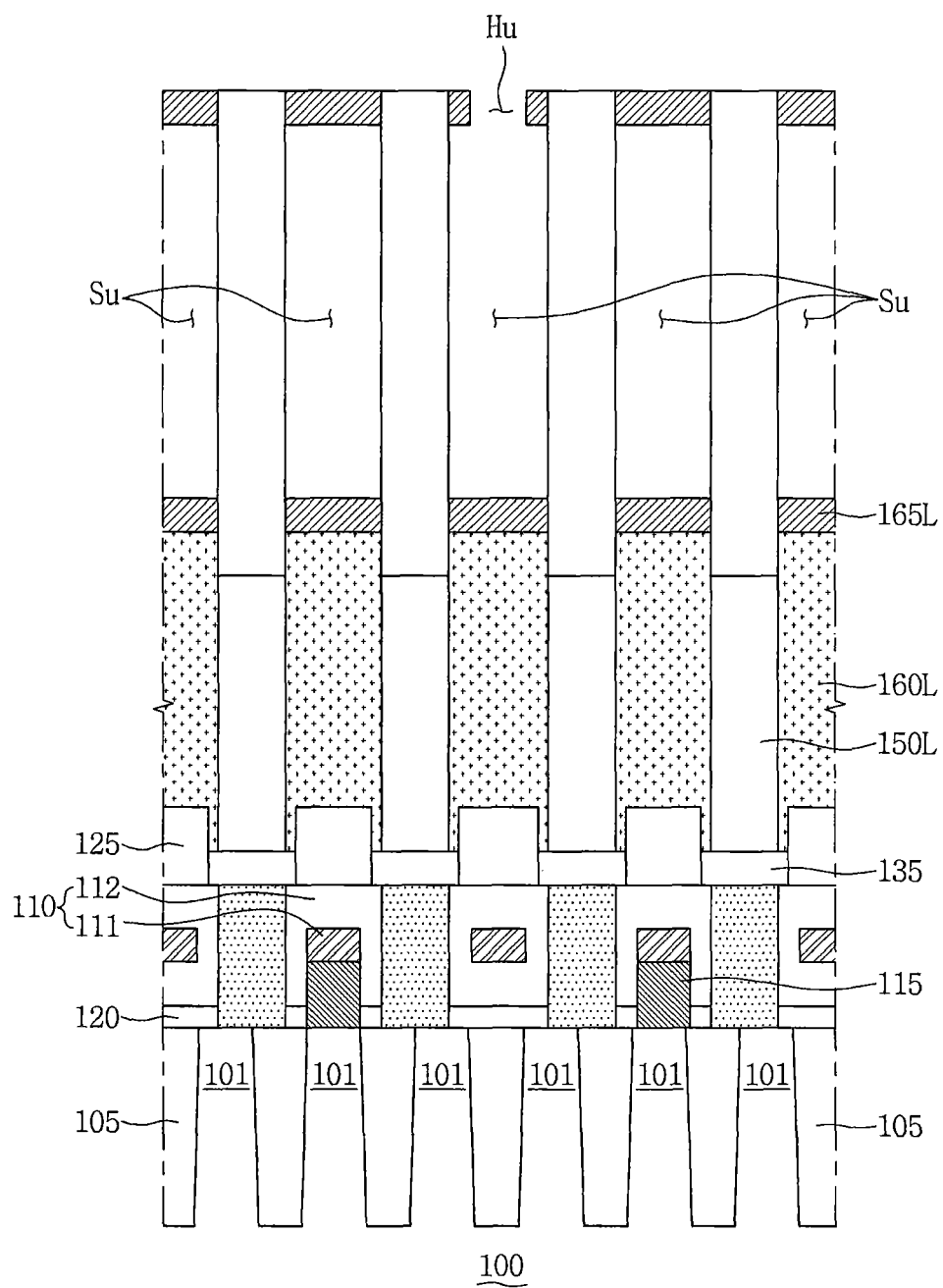

Referring to FIG. 5G, the method may include forming an upper hole Hu selectively exposing the upper molding insulating layer 160U by patterning the upper supporters 165U, and removing the upper molding insulating layer 160U through the upper hole Hu. The upper molding insulating layer 160U may be removed to form upper spaces Su between the upper supporters 165U and the lower supporters 165L.

Figure 5H:
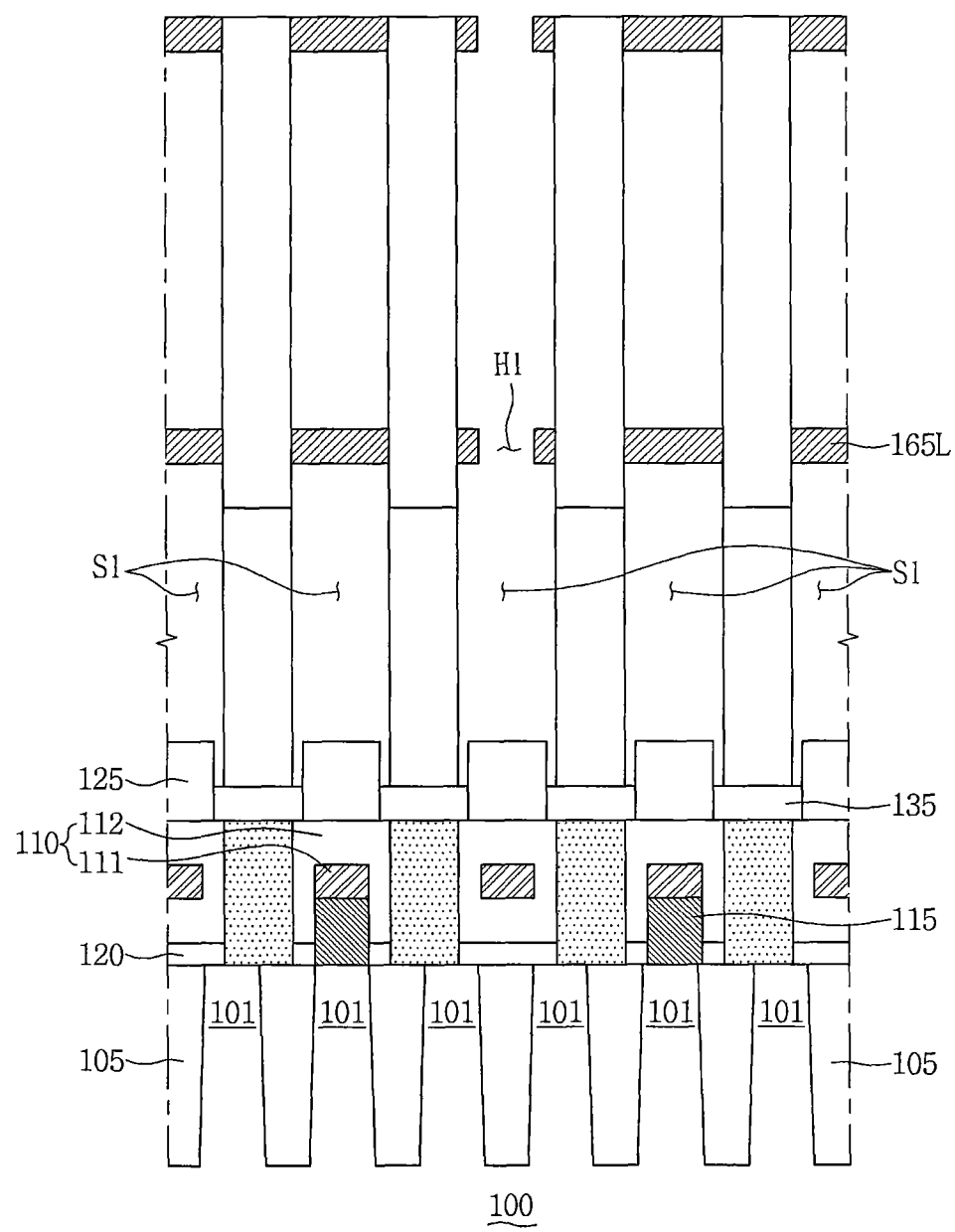

Referring to FIG. 5H, the method may include forming a lower hole Hl selectively exposing the lower molding insulating layer 160L by patterning the lower supporters 165L, and removing the lower molding insulating layer 160L through the lower hole Hl. The lower molding insulating layer 160L may be removed to form lower spaces Sl between the lower supporters 165L and the guide patterns 125.

Figure 5I:
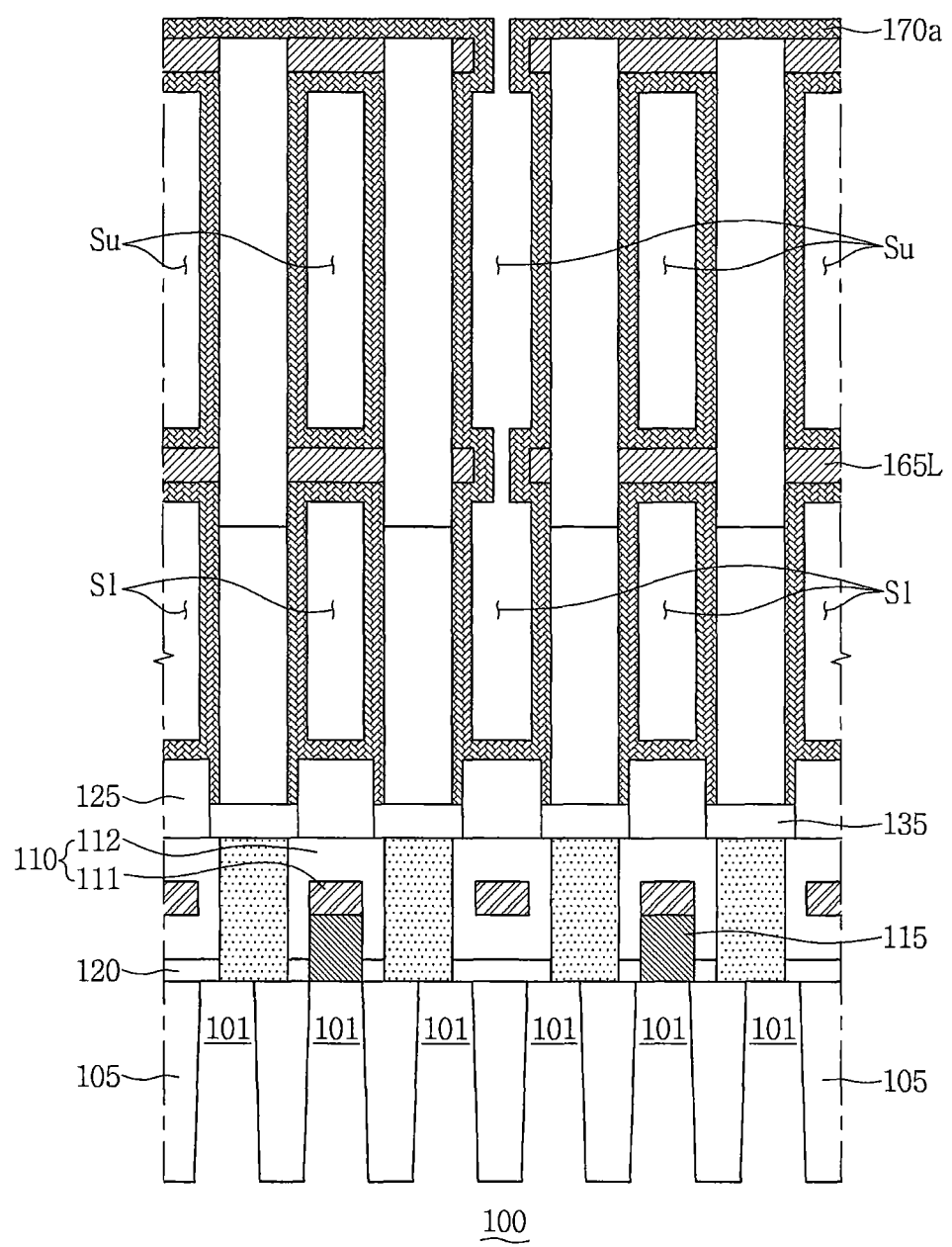

Referring to FIG. 5I, the method may include forming a silicide-forming metal layer 170a on surfaces of the lower silicon nanowires 150L, the upper silicon nanowires 150U, the lower supporters 165L, and the upper supporters 165U.

Figure 5J:
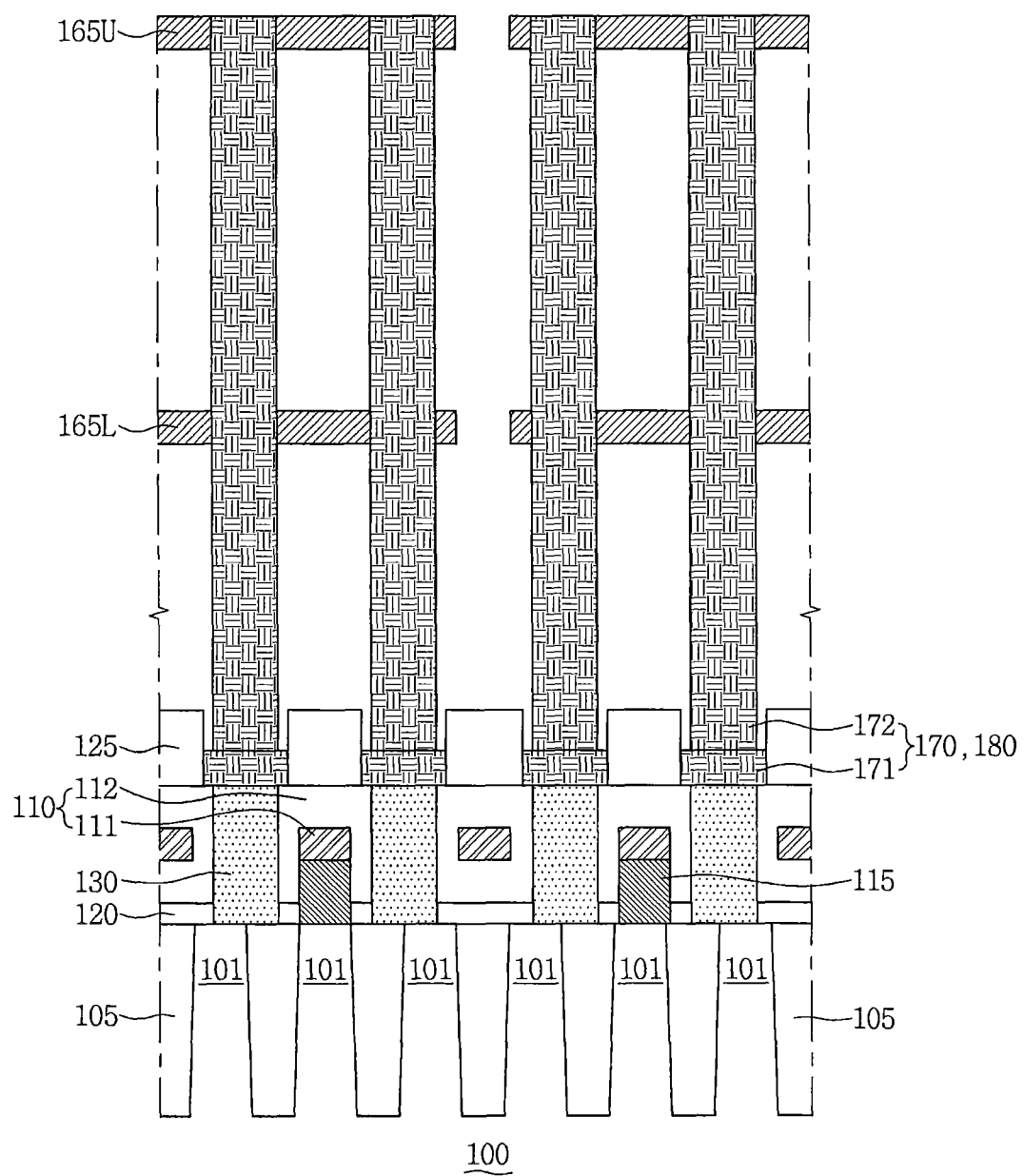

Referring to FIG. 5J, the method may include forming storage electrodes 180 including base silicide patterns 171 and main silicide patterns 172 by performing a silicidation process on the base patterns 135, the lower silicon nanowires 150L, and the upper silicon nanowires 150U. The remaining silicide-forming metal layer 170a may be removed.

The method may include conformally forming a capacitor dielectric layer 184 on surfaces of the storage electrodes 180, the lower supporters 165L, and the upper supporters 165U with reference further to FIGS. 2B to 2D, and forming a plate electrode 188 on the capacitor dielectric layer 184. Thus, capacitor structures 190 may be formed.

FIGS. 6A to 6E are cross-sectional views for describing a method of fabricating a semiconductor device in accordance with various embodiments of the inventive concept.

Figure 6A:
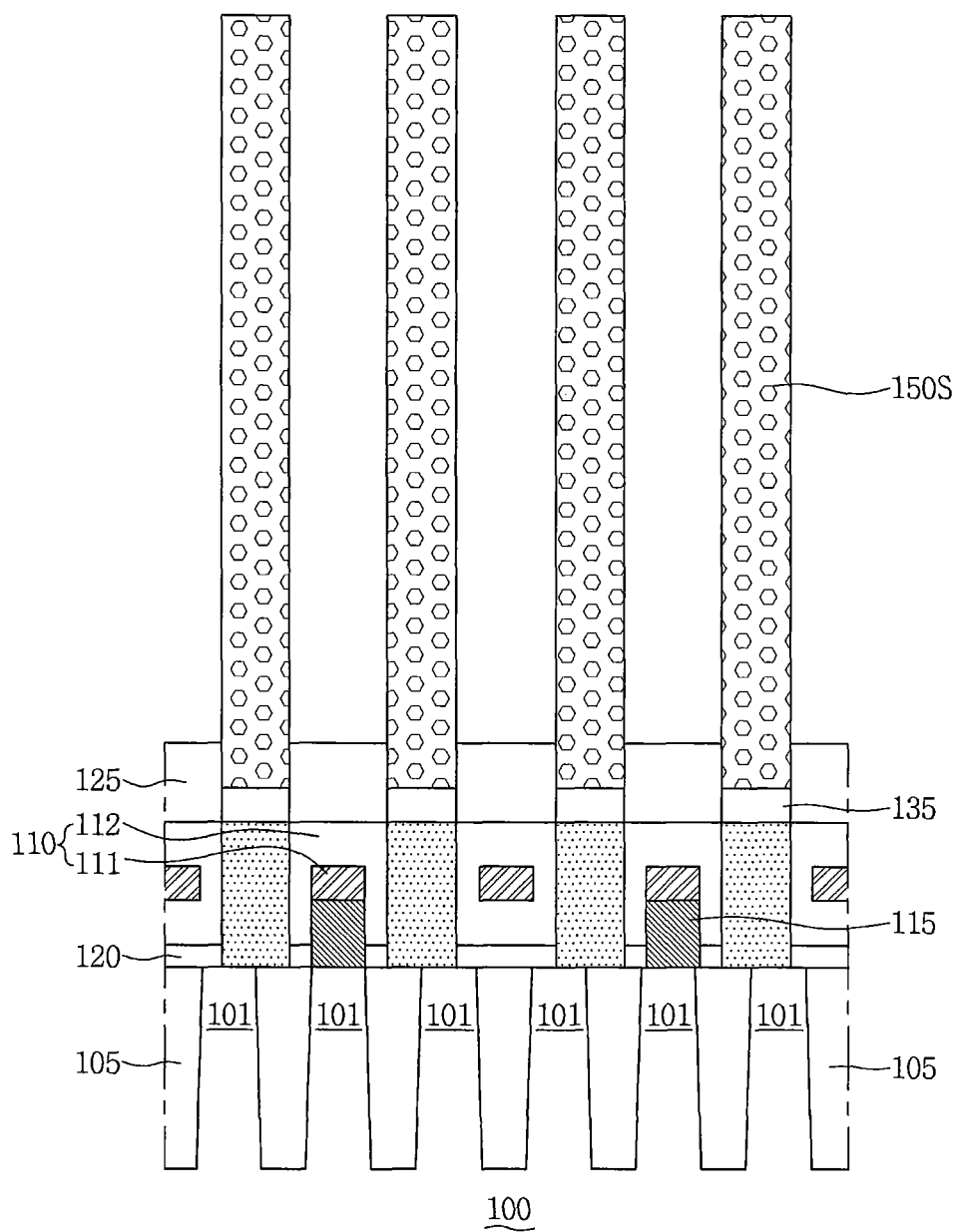
FIGS. 6A through 6E are cross-sectional views describing a method of fabricating a semiconductor device in accordance with various embodiments of the inventive concept.

Referring to FIG. 6A, the method of fabricating a semiconductor device in accordance with the embodiment of the inventive concept may include forming sacrificial nanowires 150S on base patterns 135 by performing a nanowire growth process described with reference to FIGS. 3A and 3B. The sacrificial nanowires 150S may include an insulating material, for example, zinc oxide (ZnO). The base patterns 135 may include poly-crystalline silicon, a metal such as W or Ti, or a metal compound such as TiN. In various embodiments, the base patterns 135 include poly-crystalline silicon.

Figure 6B:
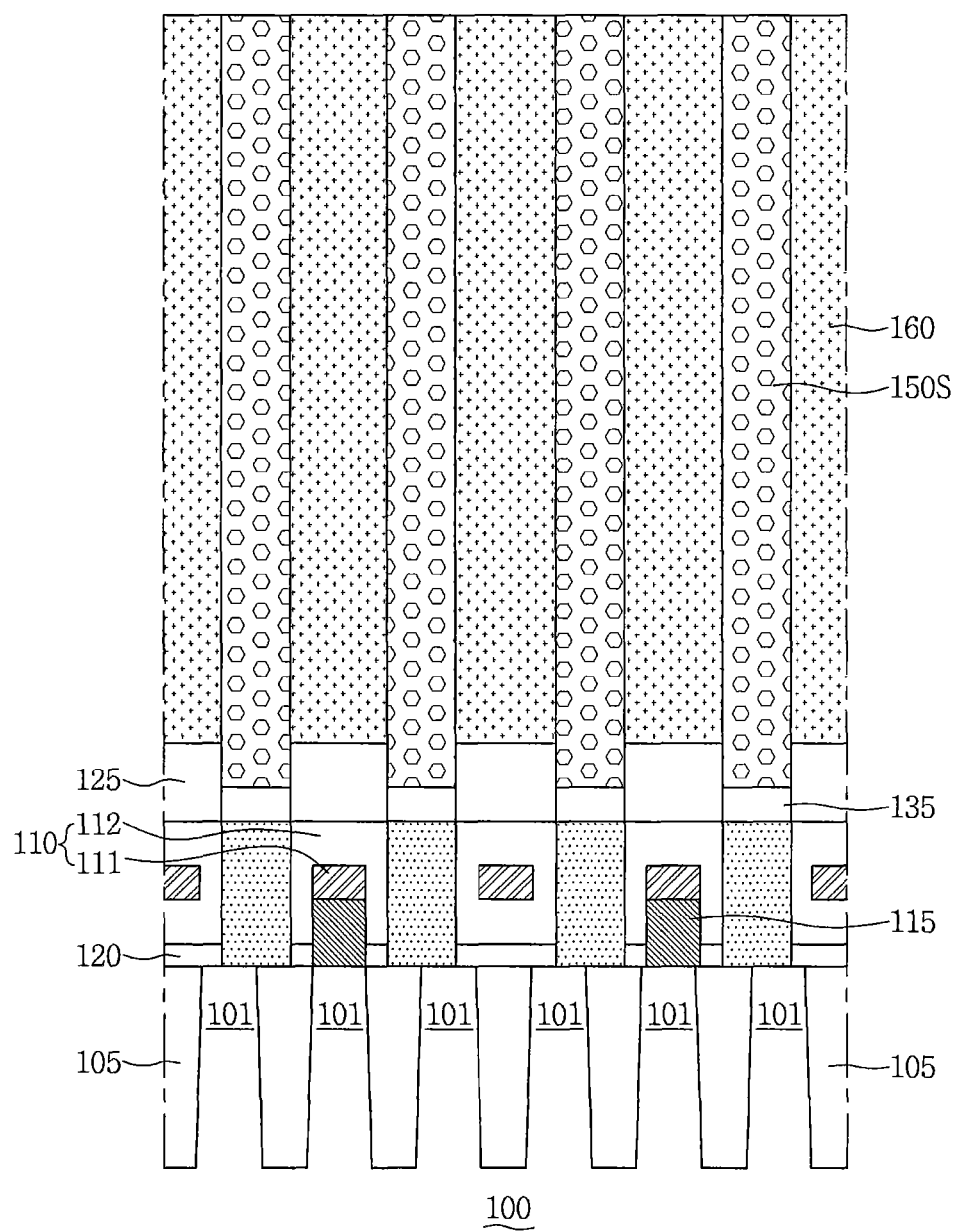

Referring to FIG. 6B, the method may include forming a molding insulating layer 160 between the sacrificial nanowires 150S, and performing a planarization process so that an upper surface of the molding insulating layer 160 and upper surfaces of the sacrificial nanowires 150S are coplanar. In some embodiments, the molding insulating layer 160 may fill spaces between the sacrificial nanowires 150S.

Figure 6C:
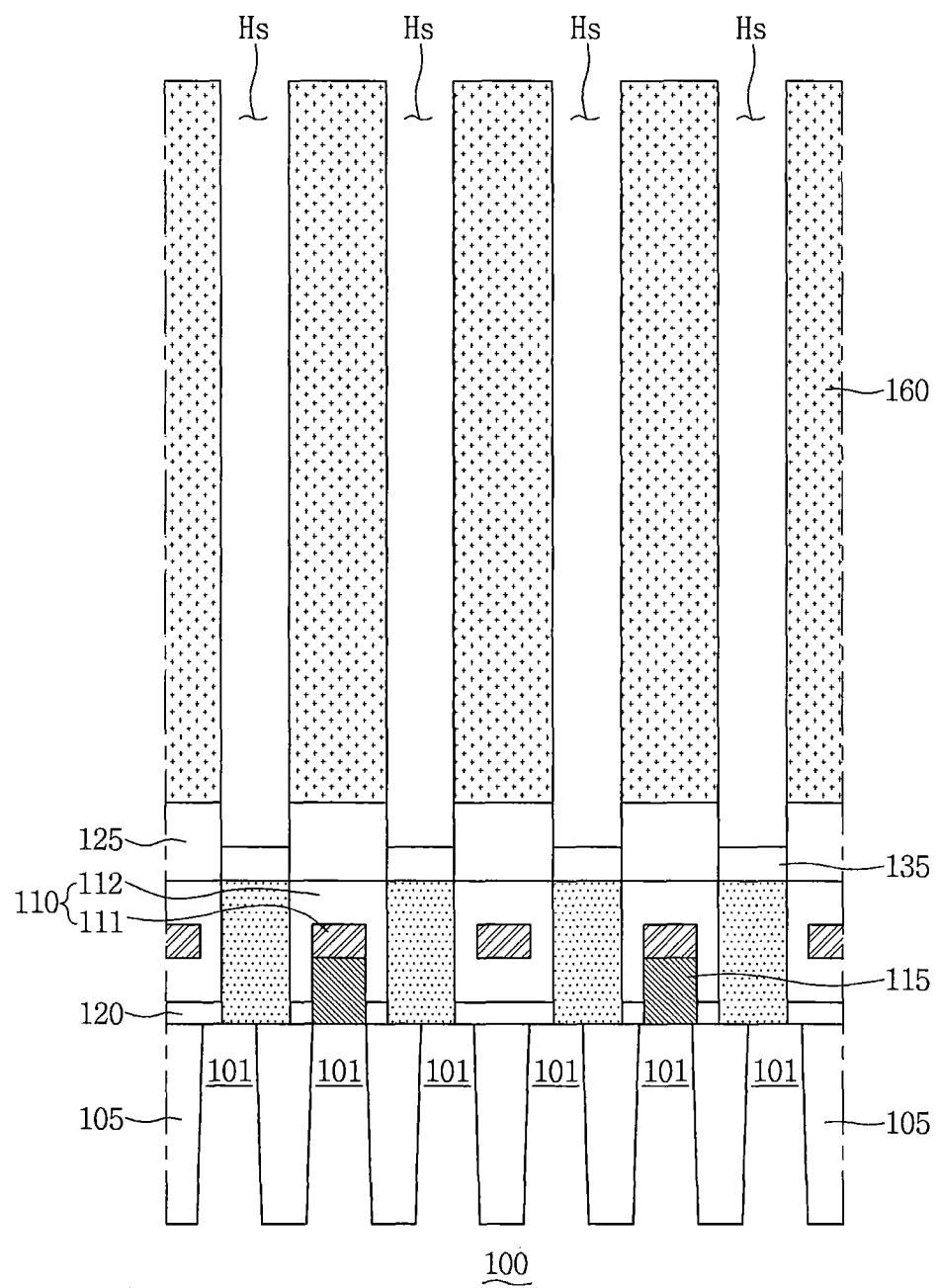

Referring to FIG. 6C, the method may include forming storage holes Hs by removing the sacrificial nanowires 150S. Surfaces of the base patterns 135 may be exposed in the storage holes Hs.

Figure 6D:
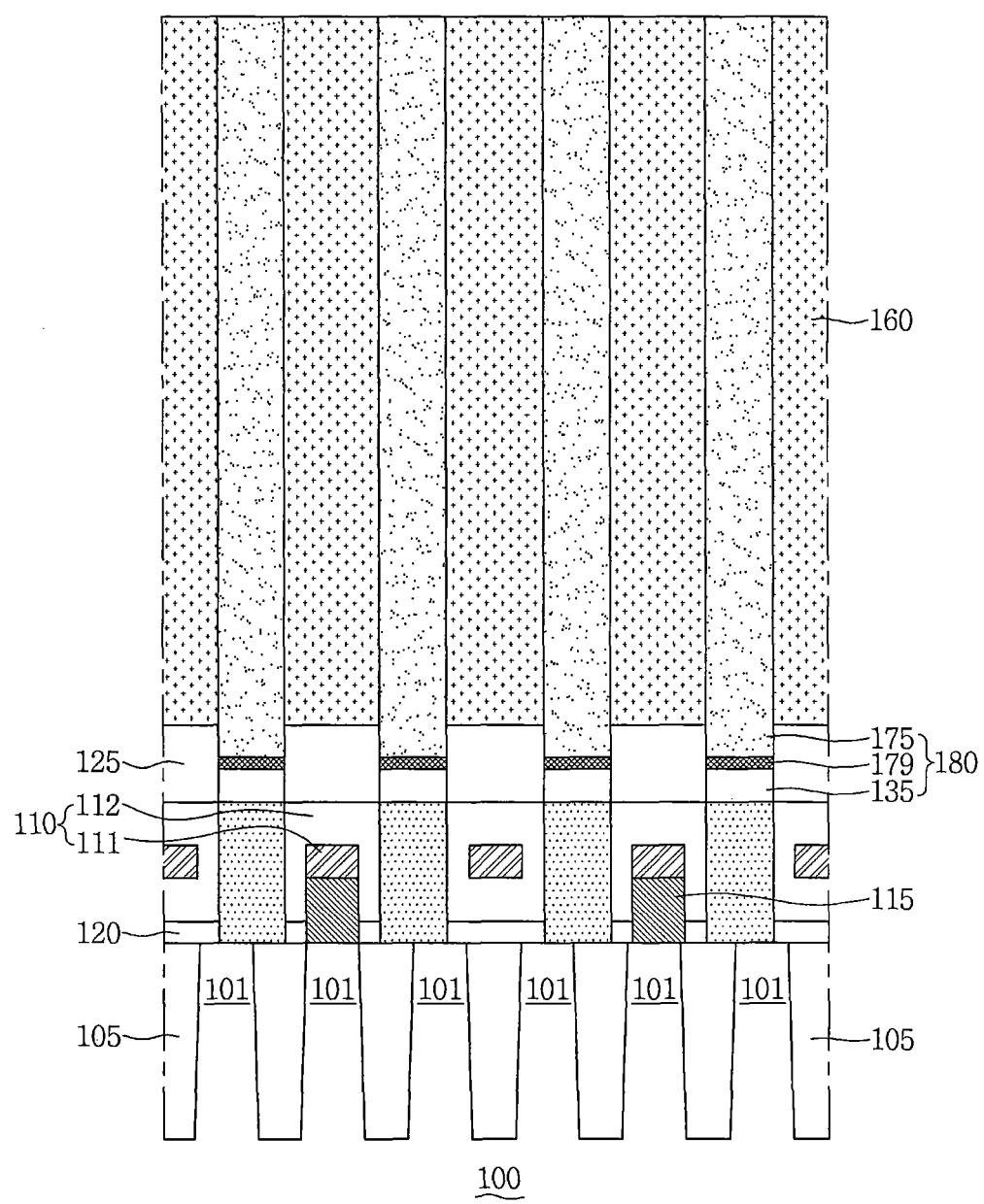

Referring to FIG. 6D, the method may include forming barrier patterns 179 and metal patterns 175 in the storage holes Hs. Thus, storage electrodes 180 including the base patterns 135, the barrier patterns 179, and the metal patterns 175 may be formed. The metal patterns 175 may include a metal such as W, a metal compound such as TiN, or another conductive material. The barrier patterns 179 may include a metal silicide such as WSi, TiSi, CoSi, or NiSi, or a metal compound such as TiN. Upper surfaces of the metal patterns 175 and the molding insulating layer 160 may be planarized.

In other embodiments, when the base patterns 135 include a metal, the barrier patterns 179 may be omitted.

Figure 6E:
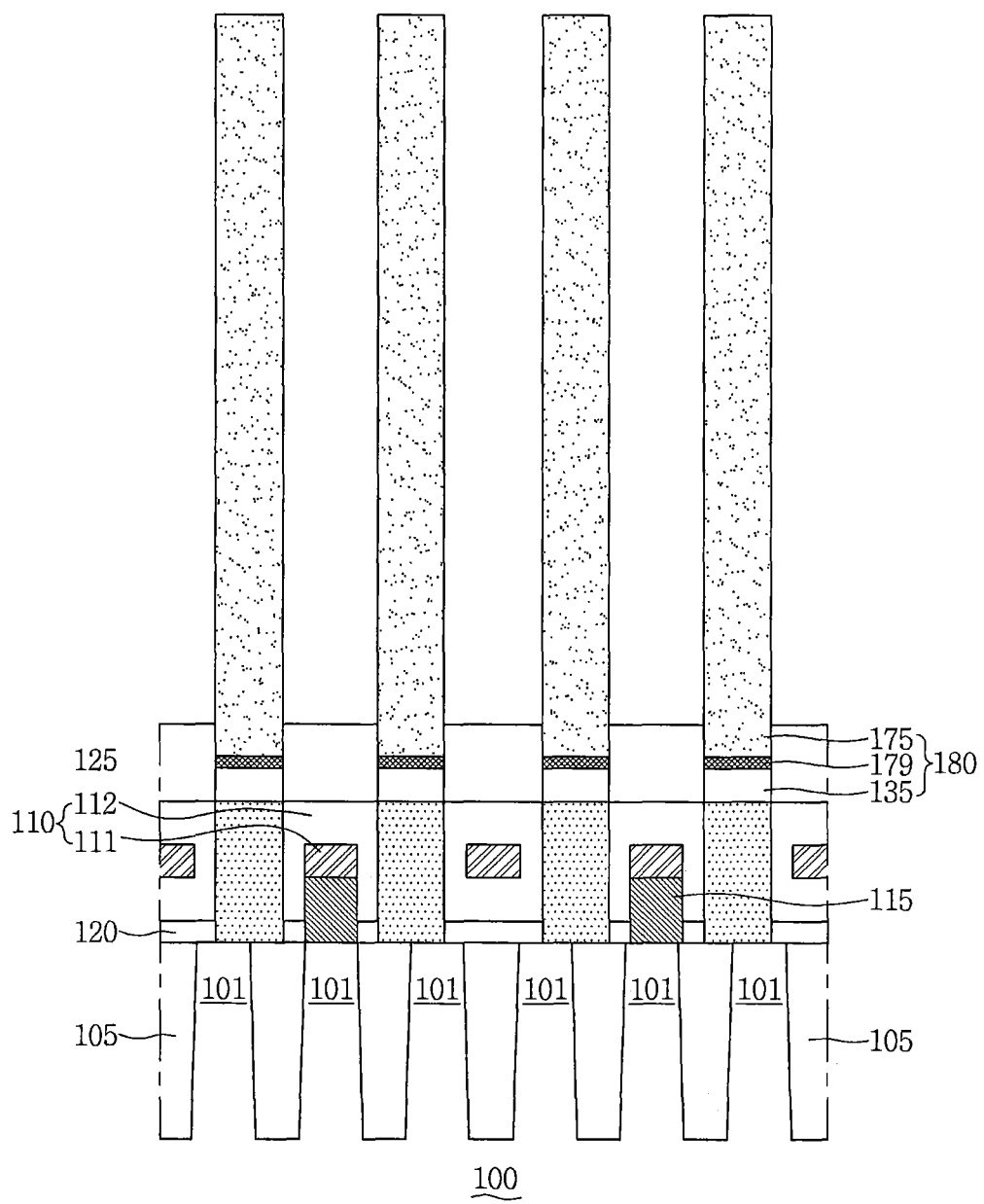

Referring to FIG. 6E, the method may include removing the molding insulating layer 160.

Next, the method may include, with reference to FIG. 2E, conformally forming a capacitor dielectric layer 184 on the storage electrodes 180, and forming a plate electrode 188 on the capacitor dielectric layer 184. Thus, capacitor structures 190 may be formed. The capacitor dielectric layer 184 may also be formed on the guide patterns 125.

FIGS. 7A to 7D are cross-sectional views for describing a method of fabricating a semiconductor device in accordance with various embodiments of the inventive concept.

Figure 7A:
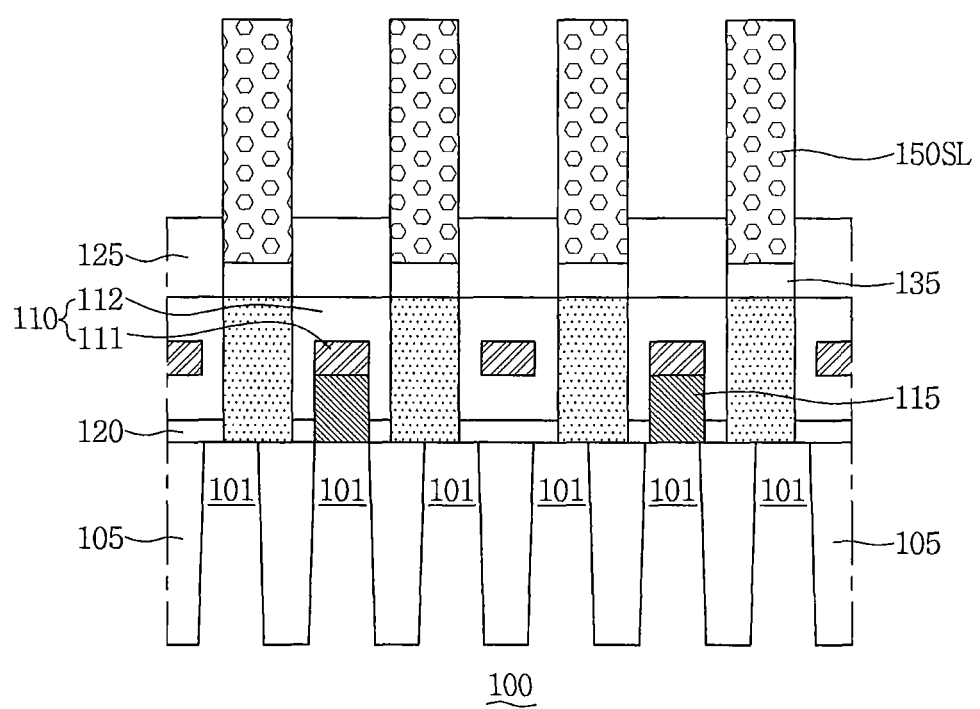
FIGS. 7A through 7D are cross-sectional views describing a method of fabricating a semiconductor device in accordance with various embodiments of the inventive concept.

Referring to FIG. 7A, the method of fabricating a semiconductor device in accordance with the embodiment of the inventive concept may include forming lower sacrificial nanowires 150SL by performing the processes described with reference to FIGS. 3A and 3B and FIG. 6A.

Figure 7B:
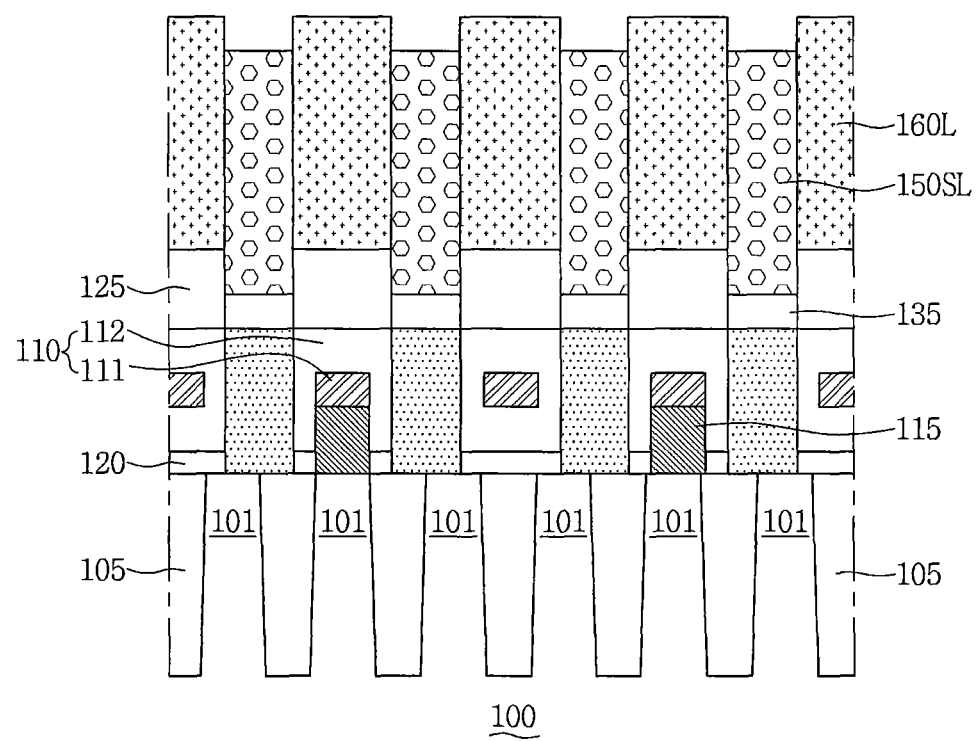

Referring to FIG. 7B, the method may include forming a lower molding insulating layer 160L between the lower sacrificial nanowires 150SL by performing the processes described with reference to FIG. 6B, and recessing upper surfaces of the lower sacrificial nanowires 150SL by performing a planarization process. In some embodiments, the lower molding insulating layer 160L may fill spaces between the lower sacrificial nanowires 150SL. The lower molding insulating layer 160L may be used as a guide for growing the nanowire.

Figure 7C:
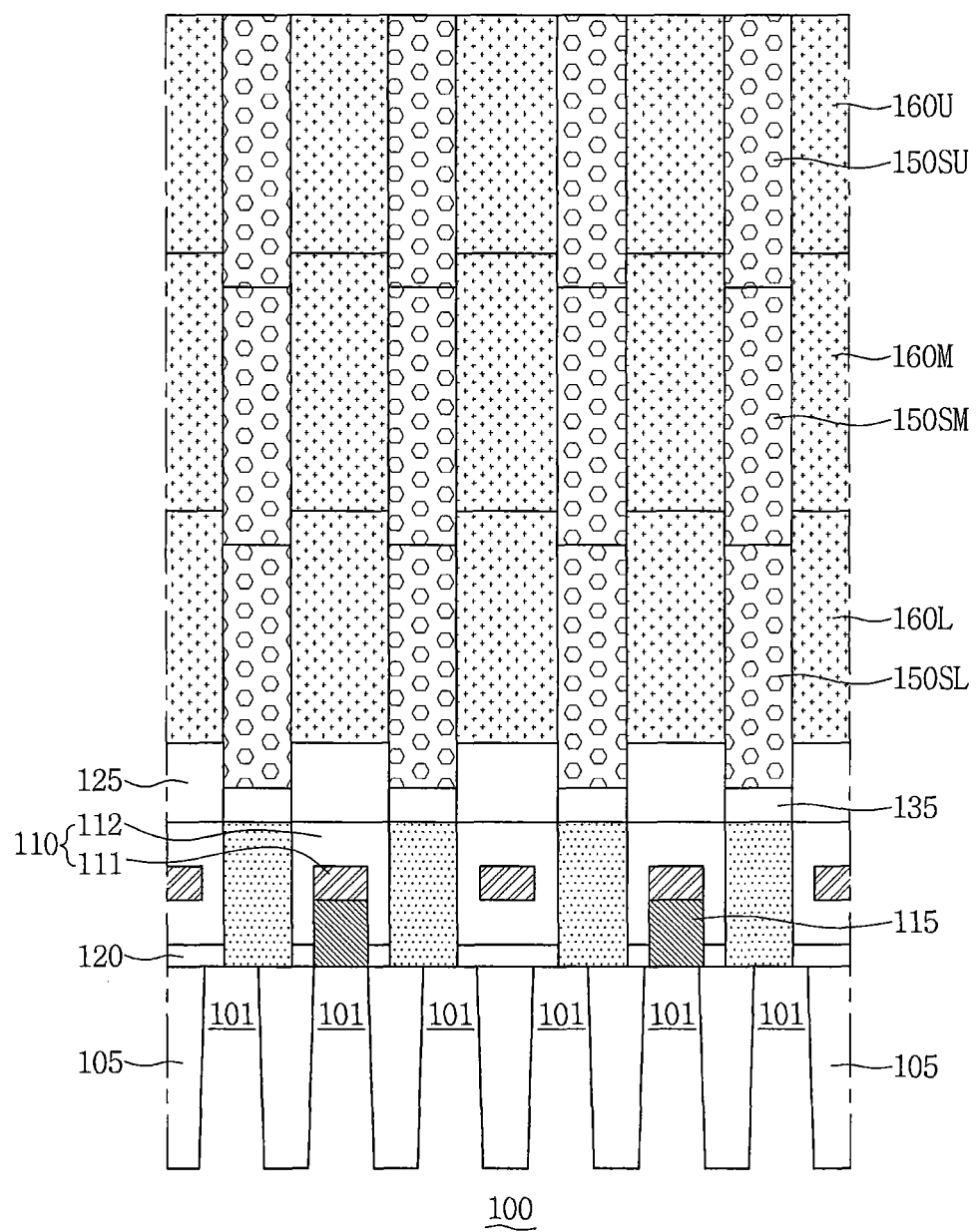

Referring to FIG. 7C, the method may include forming intermediate sacrificial nanowires 150SM, an intermediate molding insulating layer 160M, upper sacrificial nanowires 150SU, and an upper molding insulating layer 160U by repeatedly performing the processes described with reference to FIG. 7B, and performing a planarization process so that upper surfaces of the upper sacrificial nanowires 150SU and an upper surface of the upper molding insulating layer 160U are coplanar.

Figure 7D:
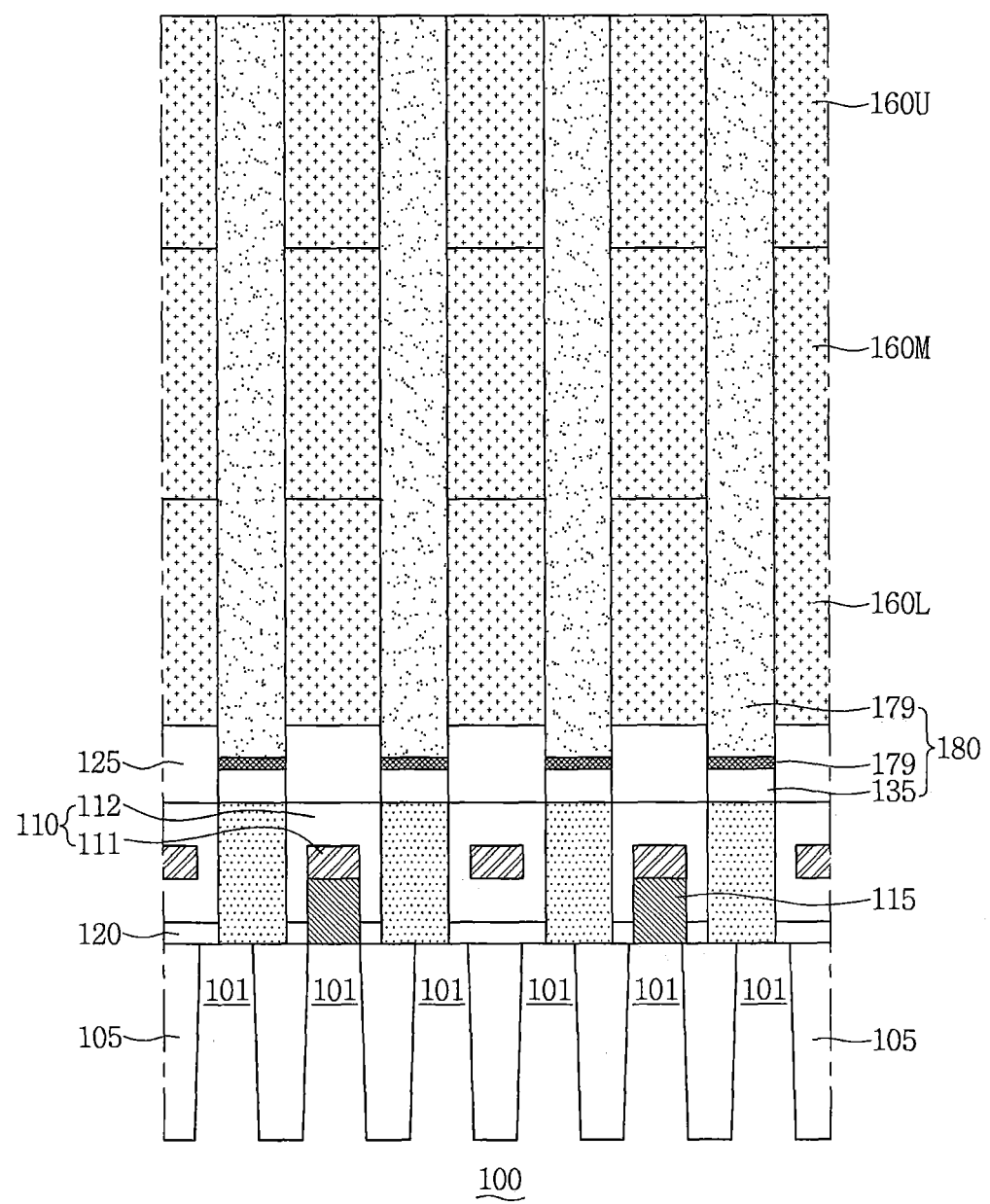

Referring to FIG. 7D, the method may include removing the upper sacrificial nanowires 150SU, the intermediate sacrificial nanowires 150SM, and the lower sacrificial nanowires 150SL, and forming barrier patterns 179 and metal patterns 175 in the holes in which the upper sacrificial nanowires 15QSU, the intermediate sacrificial nanowires 150SM, and the lower sacrificial nanowires 150SL have been removed. Thus, storage electrodes 180 including base patterns 135, the barrier patterns 179, and the metal patterns 175 may be formed. In various embodiments, when the base patterns 135 include a metal, the barrier patterns 179 may be omitted.

The method may include, with reference to FIGS. 6E and 2E, removing the molding insulating layer 160, conformally forming a capacitor dielectric layer 184 on the storage electrodes 180, and forming a plate electrode 188 on the capacitor dielectric layer 184. Thus, capacitor structures 190 may be formed.

FIGS. 8A to 8E are cross-sectional views for describing a method of fabricating a semiconductor device in accordance with various embodiments of the inventive concept.

Figure 8A:
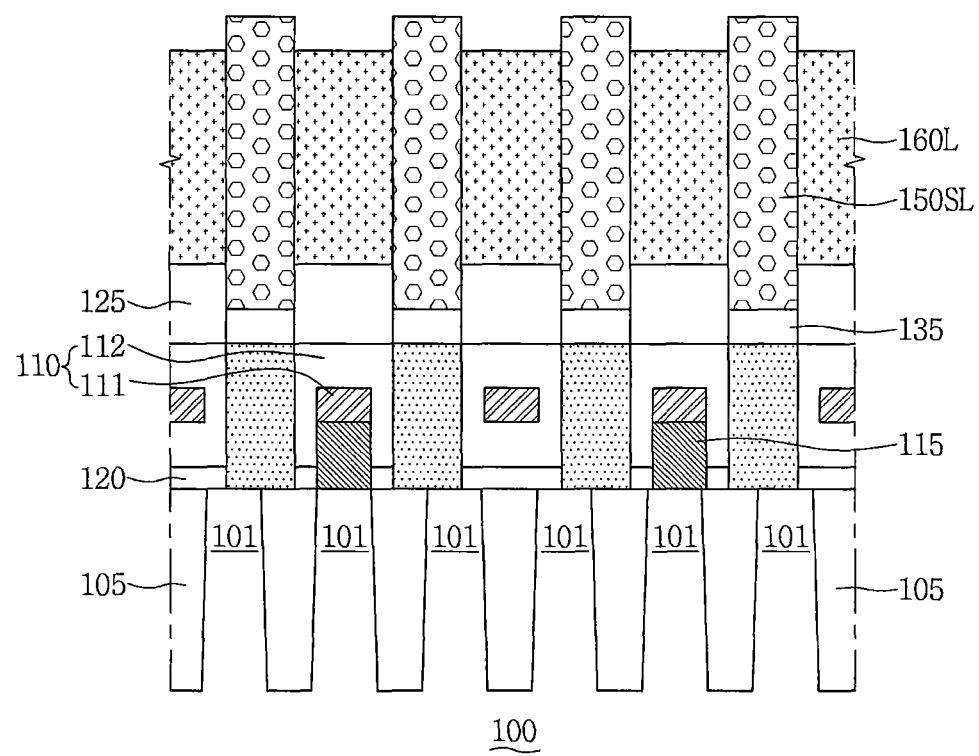
FIGS. 8A through 8E are cross-sectional views describing a method of fabricating a semiconductor device in accordance with various embodiments of the inventive concept.

Referring to FIG. 8A, the method of fabricating a semiconductor device in accordance with the embodiment of the inventive concept may include forming lower sacrificial nanowires 150SL by performing the processes described with reference to FIGS. 3A to 3D and FIG. 6A, forming a lower molding insulating layer 160L between the lower sacrificial nanowires 150SL, and recessing an upper surface of the lower molding insulating layer 160L. In some embodiments, the lower molding insulating layer 160L may fill spaces between the lower sacrificial nanowires 150SL.

Figure 8B:
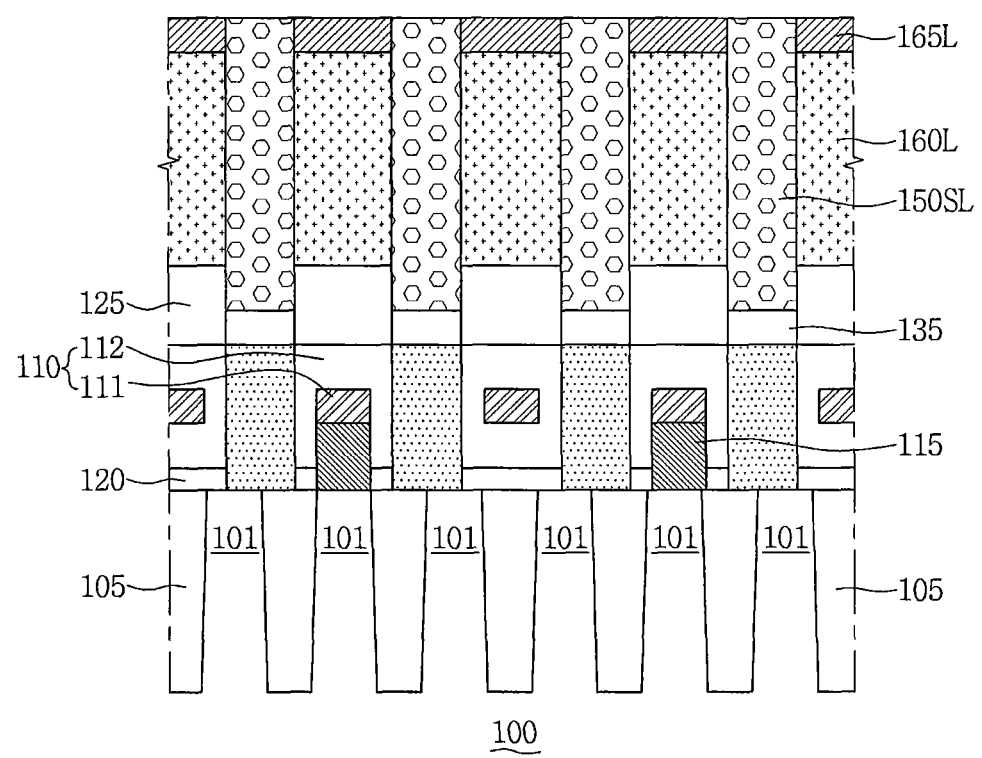

Referring to FIG. 8B, the method may include may include forming lower supporters 165L on the recessed upper surface of the lower molding insulating layer 160L, and performing a planarization process so that upper surfaces of the lower supporters 165L and upper surfaces of the lower sacrificial nanowires 150SL are coplanar.

Figure 8C:
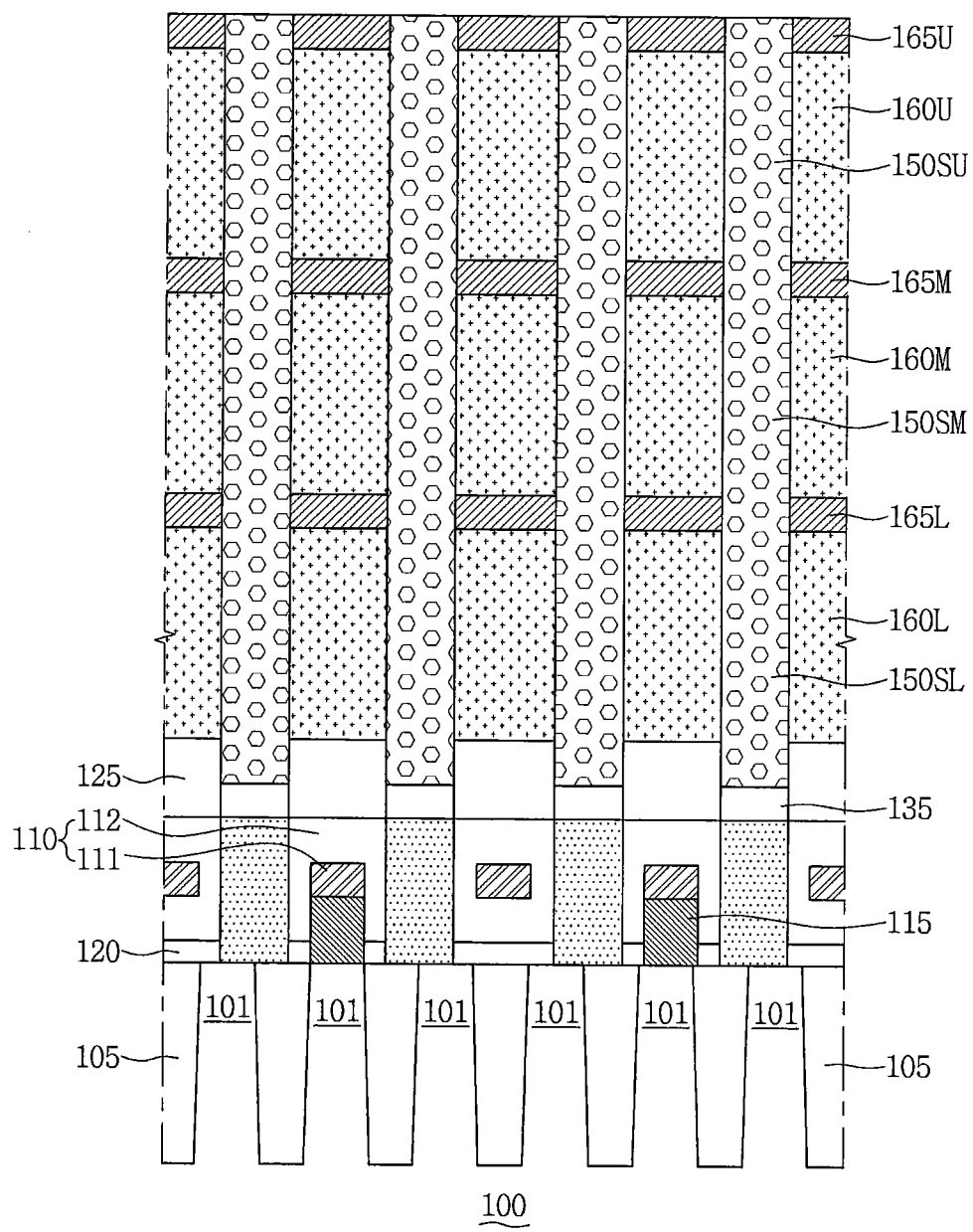

Referring to FIG. 8C, the method may include forming intermediate sacrificial nanowires 150SM, an intermediate molding insulating layer 160M, intermediate supporters 165M, upper sacrificial nanowires 15QSU, an upper molding insulating layer 160U, and upper supporters 165U by repeatedly performing the processes described with reference to FIGS. 8A and 8B.

Figure 8D:
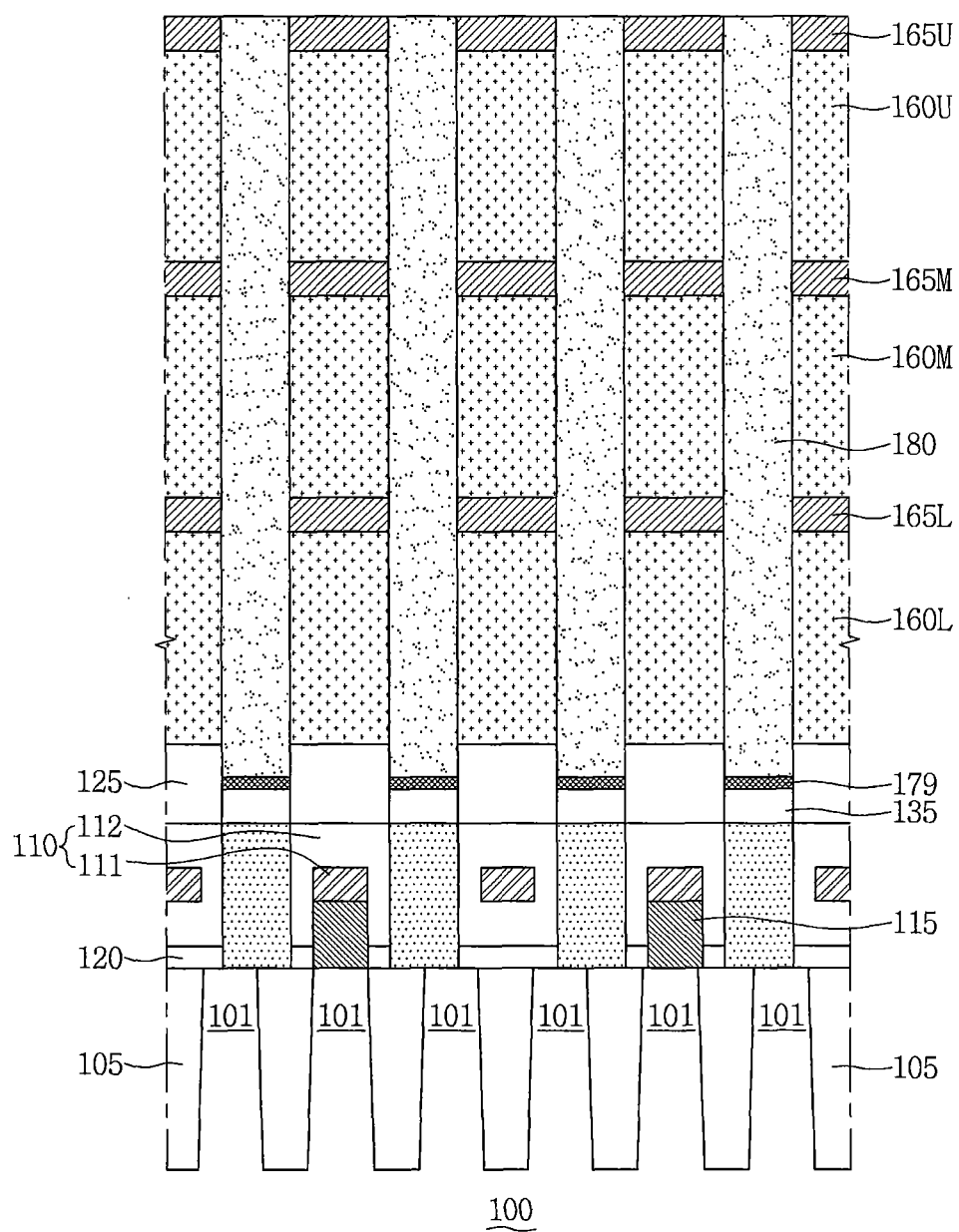

Referring to FIG. 8D, the method may include removing the upper sacrificial nanowires 150SU, the intermediate sacrificial nanowires 150SM, and the lower sacrificial nanowires 150SL, and forming storage electrodes 180 in holes in which the upper sacrificial nanowires 150SU, the intermediate sacrificial nanowires 150SM, and the lower sacrificial nanowires 150SL have been removed. In some embodiments, the storage electrodes 180 may include a conductive material and may fill the holes. In various embodiments, when base patterns 135 include a metal, barrier patterns 179 may be omitted.

Figure 8E:
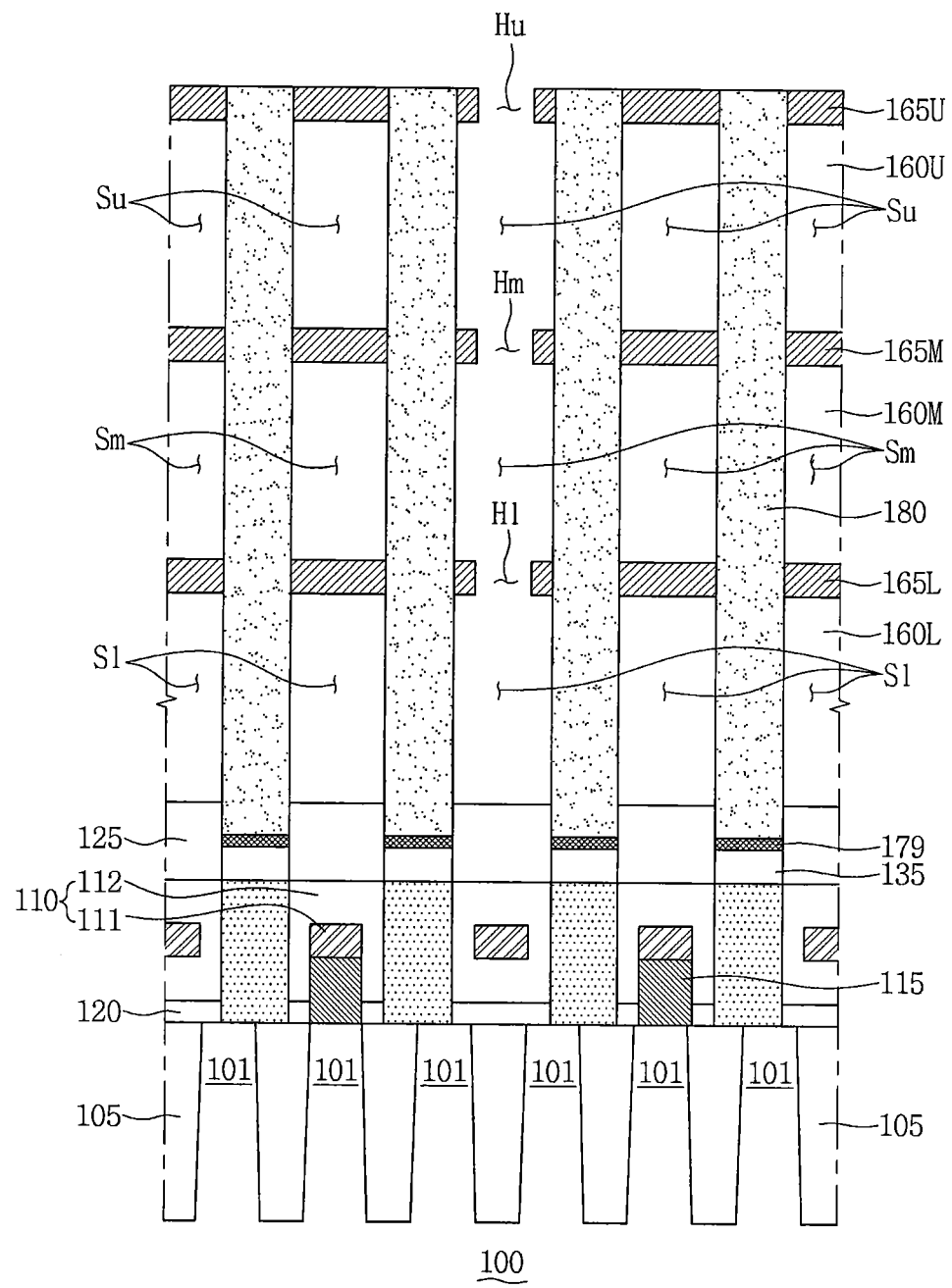

Referring to FIG. 8E, the method may include forming an upper hole Hu exposing the upper molding insulating layer 160U by patterning the upper supporter 165U by performing the processes described with reference to FIGS. 5G and 5H, removing the upper molding insulating layer 160U through the upper hole Hu, forming an intermediate hole Hm exposing the intermediate molding insulating layer 160M by patterning the intermediate supporters 165M, and removing the intermediate molding insulating layer 160M through the intermediate hole Hm, forming a lower hole Hl exposing the lower molding insulating layer 160L by patterning the lower supporters 165L, and removing the lower molding insulating layer 160L through the lower hole Hl.

The method may include conformally forming a capacitor dielectric layer 184 on surfaces of the storage electrodes 180, the lower supporters 165L, the intermediate supporters 165M, and the upper supporters 165U by performing the processes described with reference to FIGS. 2F to 2H, and forming a plate electrode 188 on the capacitor dielectric layer 184. Thus capacitor structures 190 may be formed.

Figure 9A:
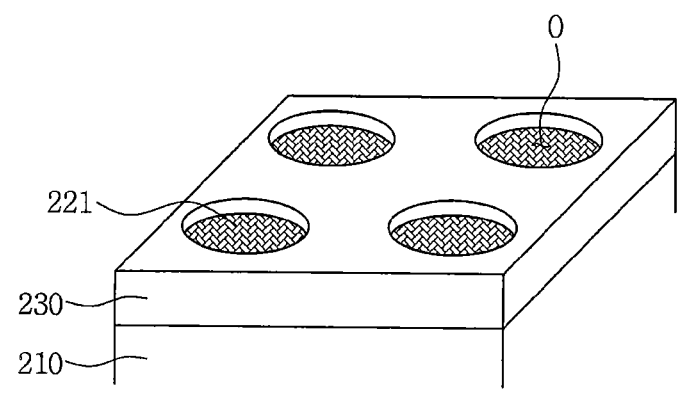
FIGS. 9A to 9C are views for describing a method of forming a contact structure in accordance with various embodiments of the inventive concept.
Figure 9B:
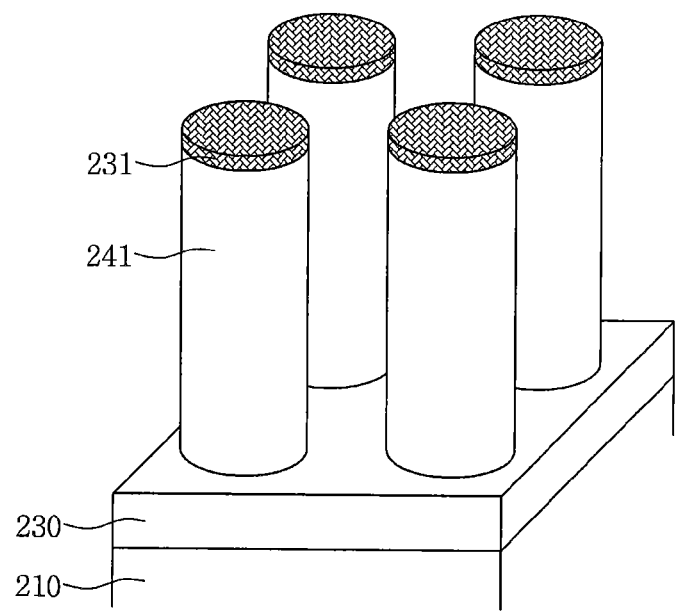
Figure 9C:
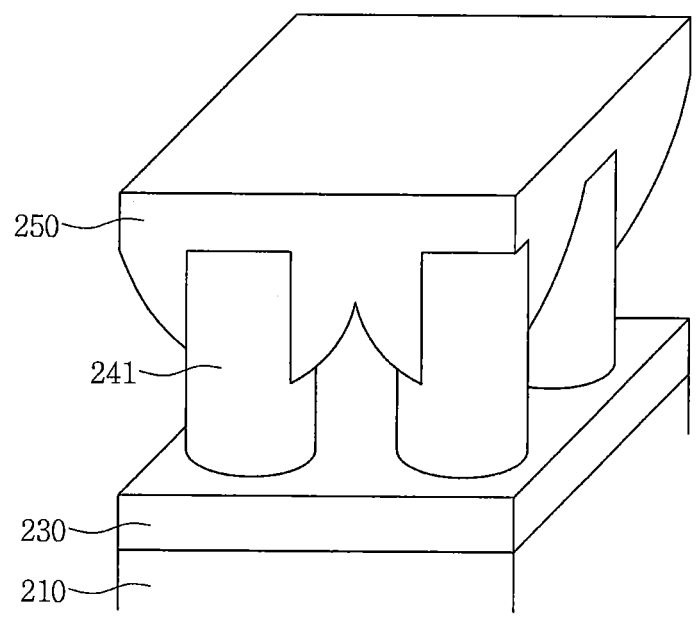

FIGS. 9A to 9C are views for describing a method of forming a contact structure in accordance with various embodiments of the inventive concept.

Referring to FIG. 9A, the method of forming the contact structure in accordance with the embodiment of the inventive concept may include forming a guide layer 230 having openings O exposing upper surfaces of contact-type pad patterns 221 on a lower layer 210 having the contact-type pad patterns 221. For example, the contact-type pad patterns 221 may include doped silicon, and the lower layer 210 may include silicon oxide. In various embodiments, the guide layer 230 may include SiN.

Referring to FIG. 9B, the method may include forming contact-type catalyst patterns 231 on the contact-type pad patterns 221, and forming contact plugs 241 by performing a nanowire growth process using the contact-type catalyst patterns 231 as seeds. The contact-type catalyst patterns 231 may be disposed on the contact plugs 241.

The contact plugs 241 may include silicon nanowires, a silicide, or a metal. For example, the contact plugs 241 may be formed by growing silicon nanowires and siliciding the silicon nanowires, or by growing insulating nanowires and substituting the insulating nanowires with a metal.

Referring to FIG. 9C, the method may include forming a capping insulating layer 250 having a very low filling property on the contact plugs 241. For example, the capping insulating layer 250 may be formed between upper portions of the contact plugs 241 without being formed between lower portions of the contact plugs 241. In some embodiments, the capping insulating layer 250 may fill spaces between the upper portions of the contact plugs 241. Accordingly, air gaps AG may be formed between the lower portions and intermediate portions of the contact plugs 241. The method may further include performing a planarization process so that upper surfaces of the contact plugs 241 are coplanar with an upper surface of the capping insulating layer 250. The catalyst patterns 140 may be removed.

Figure 10A:
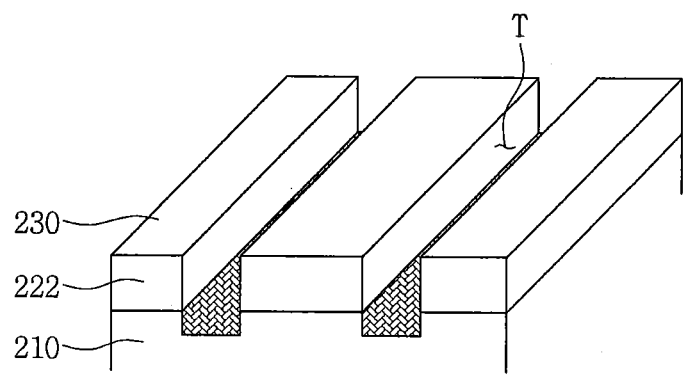
FIGS. 10A to 10C are views for describing a method of forming a line structure in accordance with various embodiments of the inventive concept.
Figure 10B:
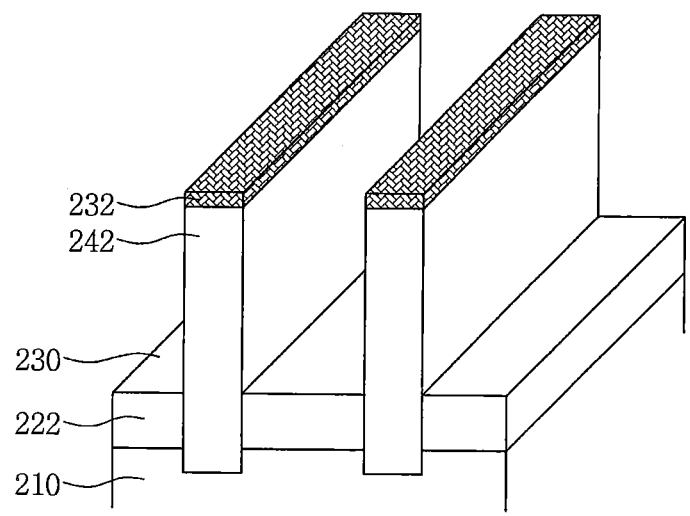
Figure 10C:
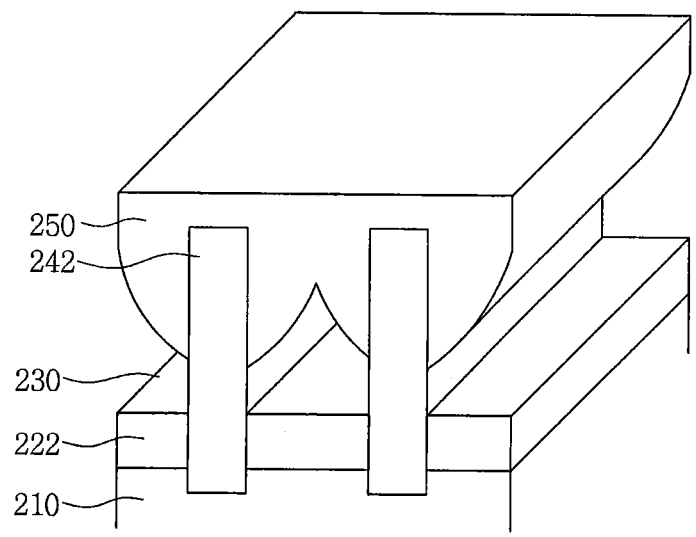

FIGS. 10A to 10C are views for describing a method of forming a line structure in accordance with various embodiments of the inventive concept.

Referring to FIG. 10A, the method of forming a line structure in accordance with the embodiment of the inventive concept may include forming a guide layer 230 having trenches T exposing upper surfaces of line-type pad patterns 222 on a lower layer 210 having the line-type pad patterns 222.

Referring to FIG. 10B, the method may include forming line-type catalyst patterns 232 on the line-type pad patterns 222, and forming fence-type line patterns 242 by performing a nanowire growth process using the line-type catalyst patterns 232 as seeds. The line-type catalyst patterns 232 may be disposed on the line patterns 242. The line patterns 242 may include silicon nanowires, a silicide, or a metal. For example, the line patterns 242 may be formed by growing silicon nanowires and siliciding the silicon nanowires, or by growing insulating nanowires and substituting the insulating nanowires with a metal.

Referring to FIG. 10C, the method may include forming a capping insulating layer 250 having a very low filling property on the line patterns 242. For example, the capping insulating layer 250 may be formed between upper portions of the line patterns 242 without being formed between lower portions of the line patterns 242. In some embodiments, the capping insulating layer 250 may fill between the upper portions of the line patterns 242. Accordingly, air gaps AG may be formed between the lower portions and intermediate portions of the line patterns 242. The method may further include performing a planarization process so that upper surfaces of the line patterns 242 are coplanar with an upper surface of the capping insulating layer 250. The line-type catalyst patterns 232 may be removed.

The capping insulating layer 250 may be formed in a process with a very low filling property. For example, the capping insulating layer 250 may be formed using a plasma enhanced chemical vapor deposition (PE-CVD) method using a gas cluster ion beam (GCIB) or a high density plasma chemical vapor deposition (HDP-CVD) method.

In the methods of fabricating semiconductor devices in accordance with various embodiments of the inventive concept, since capacitor structures, contact plugs, and line patterns having high aspect ratios are formed without performing a photolithography process with a high level of difficulty, productivity may increase and manufacturing costs of products may decrease.

Figure 11A:
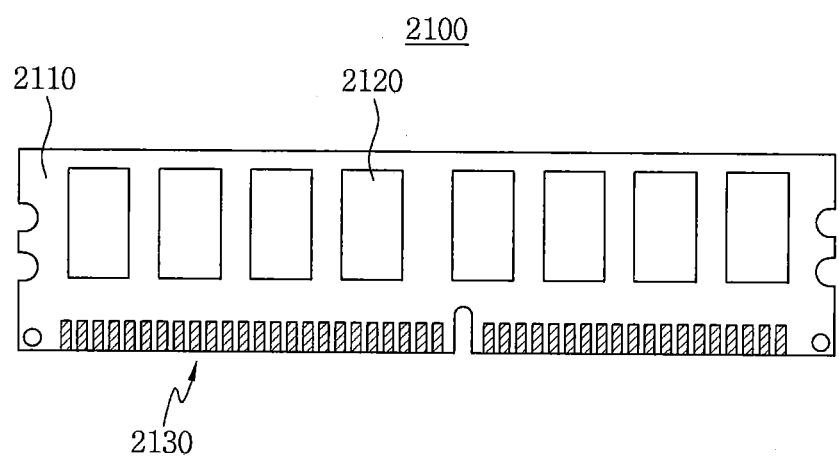
FIG. 11A is a diagram conceptually illustrating a memory module including at least one of semiconductor devices fabricated in accordance with various embodiments of the inventive concept.

FIG. 11A is a diagram conceptually illustrating a memory module 2100 including at least one of the semiconductor devices 10A to 10H fabricated in accordance with various embodiments of the inventive concept. Referring to FIG.

11A, the memory module 2100 in accordance with various embodiments of the inventive concept may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include one of the semiconductor devices 10A to 10H fabricated in accordance with the various embodiments of the inventive concept. The plurality of terminals 2130 may include a metal such as copper (Cu). Each of the terminals 2130 may be electrically connected to each of the memory devices 2120.

Figure 11B:
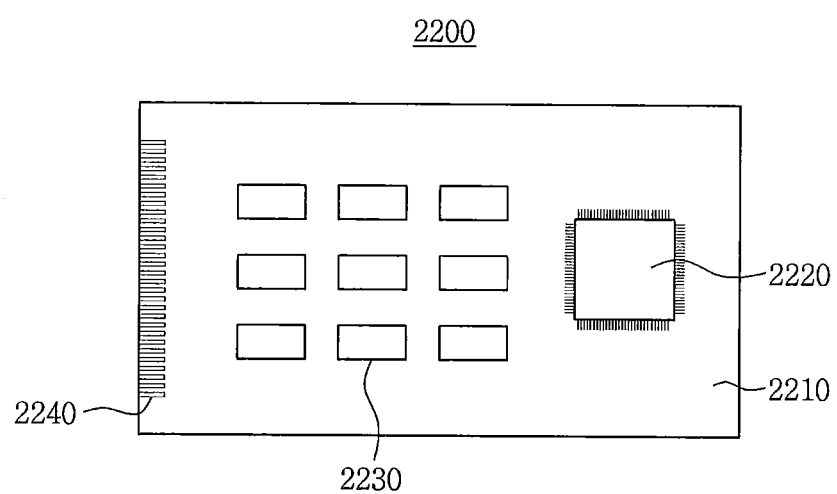
FIG. 11B is a diagram conceptually illustrating a semiconductor module in accordance with various embodiments of the inventive concept.

FIG. 11B is a diagram conceptually illustrating a semiconductor module 2200 in accordance with various embodiments of the inventive concept. Referring to FIG. 11B, the semiconductor module 2200 in accordance with the embodiment of the inventive concept may include a processor 2220 and semiconductor devices 2230 mounted on a module substrate 2210. The processor 2220 or the semiconductor devices 2230 may include at least one of the semiconductor devices 10A to 10H fabricated in accordance with the various embodiments of the inventive concept. Conductive input/output terminals 2240 may be disposed on at least one side of the module substrate 2210.

Figure 11C:
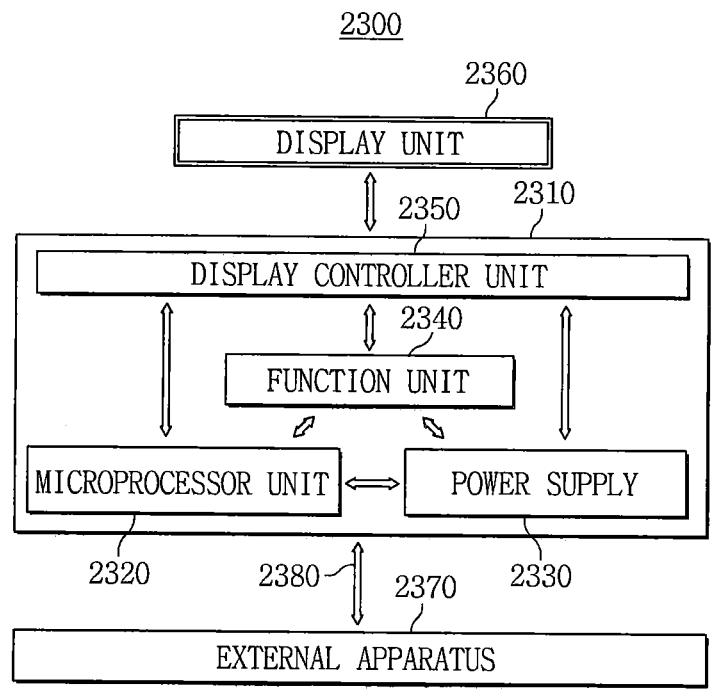
FIGS. 11C and 11D are block diagrams conceptually illustrating electronic systems in accordance with various embodiments of the inventive concept.

FIG. 11C is a block diagram conceptually illustrating an electronic system 2300 in accordance with various embodiments of the inventive concept. Referring to FIG. 11C, the electronic system 2300 in accordance with the embodiment of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard having a printed circuit board (PCB), and/or a case. The microprocessor unit 2320, the power supply 2330, the function unit 2340, and the display controller unit 2350 may be installed or arranged on an upper surface or an inside of the body 2310. A display unit 2360 may be arranged on an upper surface of the body 2310, or an inside or outside of the body 2310. The display unit 2360 may display an image processed by the display controller unit 2350. For example, the display unit 2360 may include a liquid crystal display (LCD), an active matrix organic light emitting diode (AMO-LED), or a variety of display panels. The display unit 2360 may include a touch-screen. Accordingly, the display unit 2360 may have an input/output function. The power supply 2330 may supply a current or voltage to the microprocessor unit 2320, the function unit 2340, and the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a light, an audio and video playback processor, a wireless transmission/reception antenna, a speaker, a microphone, a USB port, and other units having various functions. The microprocessor unit 2320 or the function unit 2340 may include at least one of the semiconductor devices 10A to 10H fabricated in accordance with the various embodiments of the inventive concept.

Figure 11D:
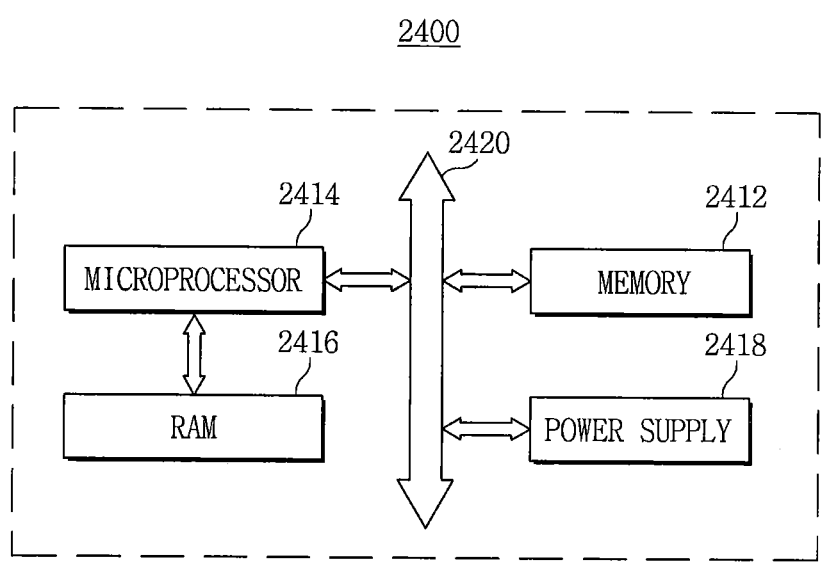

Referring to FIG. 11D, an electronic system 2400 in accordance with various embodiments of the inventive concept may include a microprocessor 2414, a memory 2412, and a user interface 2418, which perform data communication using a bus 2420. The microprocessor 2414 may include a CPU or an AP. The electronic system 2400 may further include a random access memory (RAM) 2416 directly communicating with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 10A to 10H fabricated in accordance with the various embodiments of the inventive concept.

According to various embodiments of the inventive concept, patterns having high aspect ratios may be easily formed, photolithography processes may be omitted, and parasitic capacitances existing between conductive patterns may be reduced.

The foregoing is illustrative of embodiments and is not to be construed as limiting thereof. Accordingly, all such modifications are intended to be included within the scope of this inventive concept as defined in the claims. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, the method comprising:
    forming guide patterns exposing base patterns;
    forming first nanowires on the base patterns by performing a first nanowire growth process;
    forming a first molding insulating layer between the first nanowires;
    forming holes exposing surfaces of the base patterns by removing the first nanowires; and
    forming first electrodes comprising a conductive material in the holes.

2. The method of claim 1, wherein the base patterns include at least one of poly-crystalline silicon, a metal, or a metal compound.

3. The method of claim 1, wherein the guide patterns include silicon nitride.

4. The method of claim 1, wherein the first nanowires include zinc oxide.

5. The method of claim 1, wherein the first molding insulating layer includes silicon oxide.

6. The method of claim 1, further comprising forming barrier patterns on the surfaces of the base patterns exposed in the holes.

7. The method of claim 6, wherein the barrier patterns include a metal silicide or a metal compound.

8. The method of claim 1, further comprising:
    removing the first molding insulating layer to expose surfaces of the first electrodes;
    forming a dielectric layer on the exposed surfaces of the first electrodes; and
    forming a second electrode on the dielectric layer.

9. The method of claim 8, wherein the dielectric layer is formed on surfaces of the guide patterns.

10. The method of claim 1, further comprising:
recessing upper surfaces of the first nanowires to be lower than an upper surface of the first molding insulating layer;
forming second nanowires on the first nanowires by performing a second nanowire growth process using the first molding insulating layer as a guide; and
forming a second molding insulating layer between the second nanowires on the first molding insulating layer.

11. A method of forming a semiconductor device, the method comprising:
forming guide patterns exposing base patterns;
forming first nanowires on the base patterns;
forming a first molding insulating layer between the first nanowires;
recessing an upper surface of the first molding insulating layer to be lower than upper surfaces of the first nanowires;
forming a first supporter exposing the upper surfaces of the first nanowires and surrounding side surfaces of the first nanowires on the first molding insulating layer;
forming storage holes exposing surfaces of the base patterns by removing the first nanowires; and
forming first electrodes comprising a conductive material in the storage holes.

12. The method of claim 11, further comprising:
recessing the upper surfaces of the first nanowires to be lower than an upper surface of the first supporter; and
forming second nanowires on the first nanowires using the first supporter as a guide.

13. The method of claim 12, further comprising:
forming a second molding insulating layer between the second nanowires on the first supporter;
recessing an upper surface of the second molding insulating layer to be lower than upper surfaces of the second nanowires; and
forming a second supporter surrounding side surfaces of the second nanowires on the second molding insulating layer.

14. The method of claim 13, further comprising:
forming an upper hole exposing a portion of the upper surface of the second molding insulating layer by patterning the second supporter; and
removing the second molding insulating layer through the upper hole.

15. The method of claim 14, further comprising:
forming a lower hole exposing a portion of the upper surface of the first molding insulating layer by patterning the first supporter; and
removing the first molding insulating layer through the lower hole.

* * * * *